(12) United States Patent
Hu et al.

(10) Patent No.: US 12,438,076 B2
(45) Date of Patent: Oct. 7, 2025

(54) MEMORY ARRAY HAVING AN INTERVENING MATERIAL BETWEEN ADJACENT MEMORY BLOCKS WITH AN ELONGATED SEAM THEREIN

(71) Applicant: Lodestar Licensing Group LLC, Evanston, IL (US)

(72) Inventors: Yi Hu, Boise, ID (US); Harsh Narendrakumar Jain, Boise, ID (US); Matthew J. King, Boise, ID (US)

( * ) Notice: Subject to any disclaimer, the term of this patent is extended or adjusted under 35 U.S.C. 154(b) by 357 days.

(21) Appl. No.: 17/385,299

(22) Filed: Jul. 26, 2021

(65) Prior Publication Data

US 2021/0351127 A1 Nov. 11, 2021

Related U.S. Application Data

(62) Division of application No. 16/664,618, filed on Oct. 25, 2019, now Pat. No. 11,101,210.

(51) Int. Cl.
| | |
|---|---|
| *H10B 41/27* | (2023.01) |
| *H01L 21/311* | (2006.01) |
| *H01L 21/762* | (2006.01) |
| *H01L 23/522* | (2006.01) |
| *H01L 23/528* | (2006.01) |
| *H10B 41/10* | (2023.01) |

(Continued)

(52) U.S. Cl.
CPC .... *H01L 23/5226* (2013.01); *H01L 21/31111* (2013.01); *H01L 21/76224* (2013.01);
(Continued)

(58) Field of Classification Search
CPC ........ H10B 41/27; H10B 43/27; H10B 41/10; H10B 41/30; H10B 41/35; H10B 43/10; H10B 43/30; H10B 43/35; H01L 27/11556; H01L 27/11582; H01L 27/11519; H01L 27/11565; H01L 27/11524; H01L 27/1157; H01L 29/0649; H01L 29/0653; H01L 29/6681; H01L 21/823481; H01L 21/823878; H01L 21/76224;
(Continued)

(56) References Cited

U.S. PATENT DOCUMENTS

| | | |
|---|---|---|
| 6,066,869 A | 5/2000 | Noble et al. |
| 9,748,264 B1 | 8/2017 | Jiang et al. |

(Continued)

FOREIGN PATENT DOCUMENTS

WO WO 2020/252892 12/2020

*Primary Examiner* — Younes Boulghassoul
(74) *Attorney, Agent, or Firm* — Brooks, Cameron & Huebsch, PLLC

(57) ABSTRACT

A memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Intervening material is laterally-between and longitudinally-along immediately-laterally-adjacent of the memory blocks. The intervening material comprises longitudinally-alternating first and second regions that individually have a vertically-elongated seam therein. The vertically-elongated seam in the first regions has a higher top than in the second regions. The seam tops in the second regions are elevationally-coincident with or below a bottom of an uppermost of the conductive tiers. Methods are disclosed.

12 Claims, 24 Drawing Sheets

(51) Int. Cl.
　　　*H10B 41/35*　　　(2023.01)
　　　*H10B 43/10*　　　(2023.01)
　　　*H10B 43/27*　　　(2023.01)
　　　*H10B 43/35*　　　(2023.01)
(52) U.S. Cl.
　　　CPC ......... *H01L 23/5283* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)
(58) Field of Classification Search
　　　CPC ........ H01L 21/76229; H01L 21/76232; H10D 62/115; H10D 62/116; H10D 84/0151; H10D 84/0153; H10D 84/0188; H10D 30/0243
　　　See application file for complete search history.

(56) References Cited

U.S. PATENT DOCUMENTS

| | | |
|---|---|---|
| 9,997,353 B1 | 6/2018 | Kumar et al. |
| 10,290,643 B1 | 5/2019 | Kai et al. |
| 2012/0119287 A1 | 5/2012 | Park et al. |
| 2012/0168829 A1 | 7/2012 | Zhong et al. |
| 2012/0208347 A1* | 8/2012 | Hwang ................ H01L 21/762 |
| | | 257/E21.546 |
| 2015/0303214 A1 | 10/2015 | Kim et al. |
| 2016/0049421 A1 | 2/2016 | Zhang et al. |
| 2016/0225697 A1 | 8/2016 | Lee |
| 2016/0336338 A1* | 11/2016 | Song ..................... H10B 43/27 |
| 2016/0336340 A1* | 11/2016 | Song ..................... H01L 21/764 |
| 2017/0062470 A1* | 3/2017 | Han ...................... H10B 43/10 |
| 2017/0250193 A1 | 8/2017 | Huo |
| 2017/0256645 A1 | 9/2017 | Chung et al. |
| 2018/0261616 A1 | 9/2018 | Cho et al. |
| 2019/0326313 A1 | 10/2019 | Cui et al. |
| 2019/0393238 A1* | 12/2019 | Lim ..................... H10B 43/27 |
| 2020/0058673 A1 | 2/2020 | Nishikawa et al. |
| 2020/0119036 A1* | 4/2020 | King .................... H10B 43/20 |
| 2020/0312863 A1* | 10/2020 | Iwai ..................... H10B 43/10 |
| 2021/0050364 A1 | 2/2021 | Tapias ............... H01L 21/02532 |
| 2021/0057428 A1* | 2/2021 | Hu ....................... H10B 43/10 |
| 2021/0057440 A1* | 2/2021 | Greenlee ........... H01L 21/02636 |
| 2021/0111064 A1* | 4/2021 | Billingsley ............ H10B 43/35 |
| 2021/0202324 A1 | 7/2021 | Scarbrough et al. |

* cited by examiner

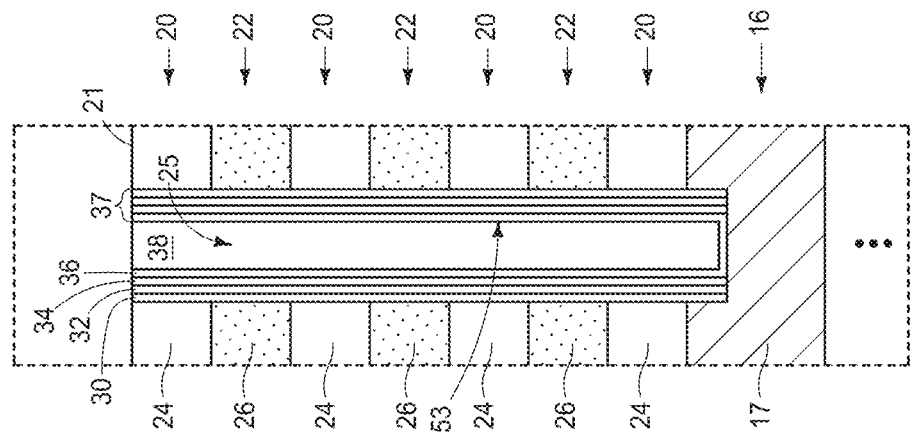
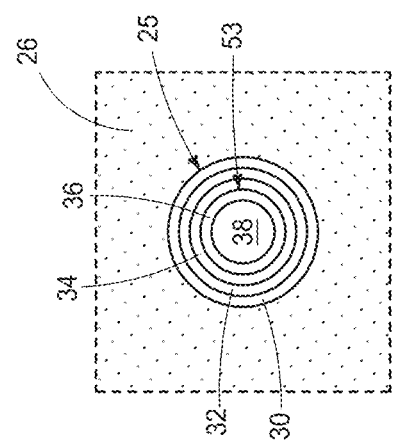

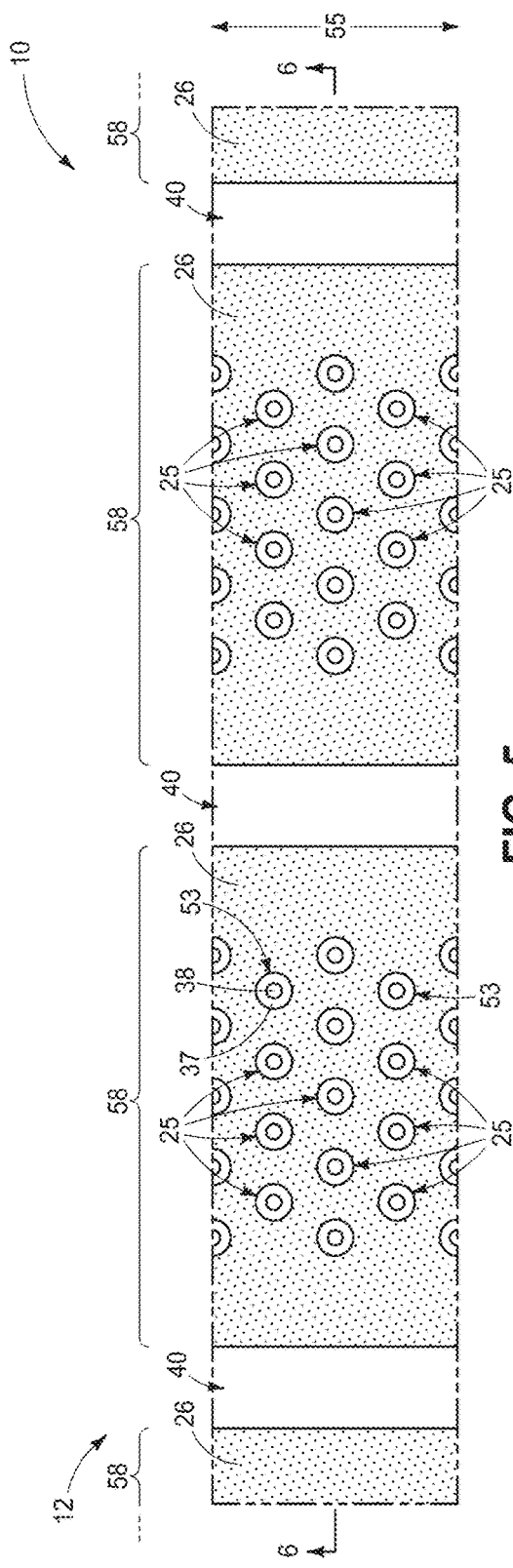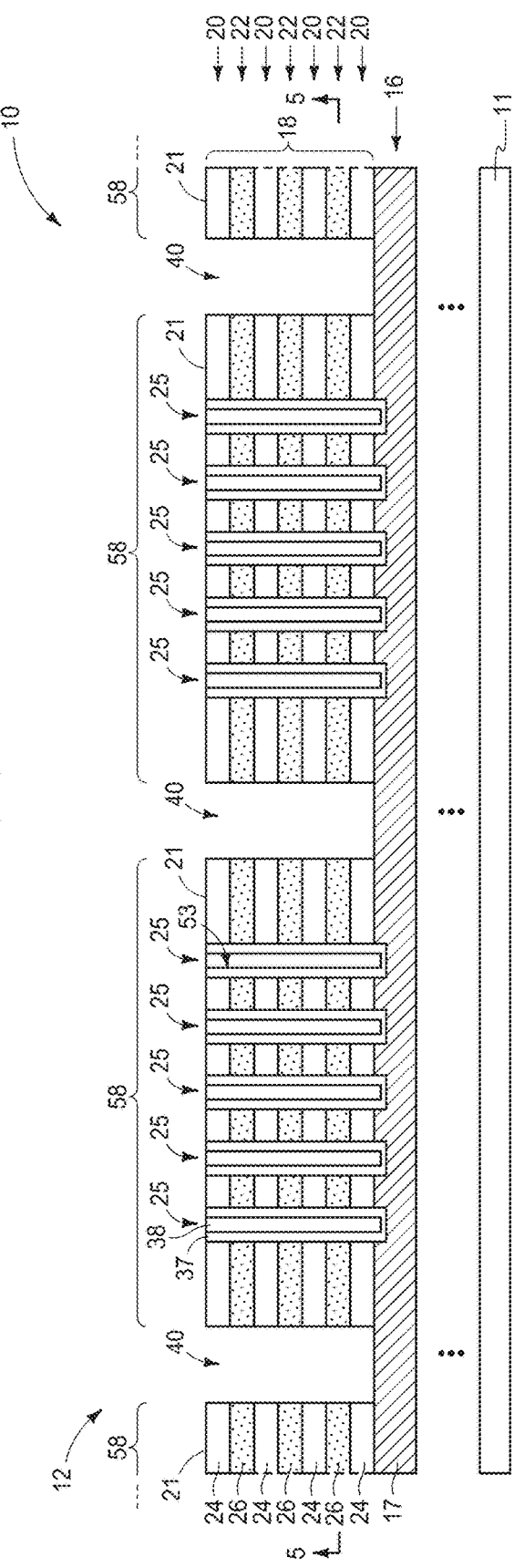

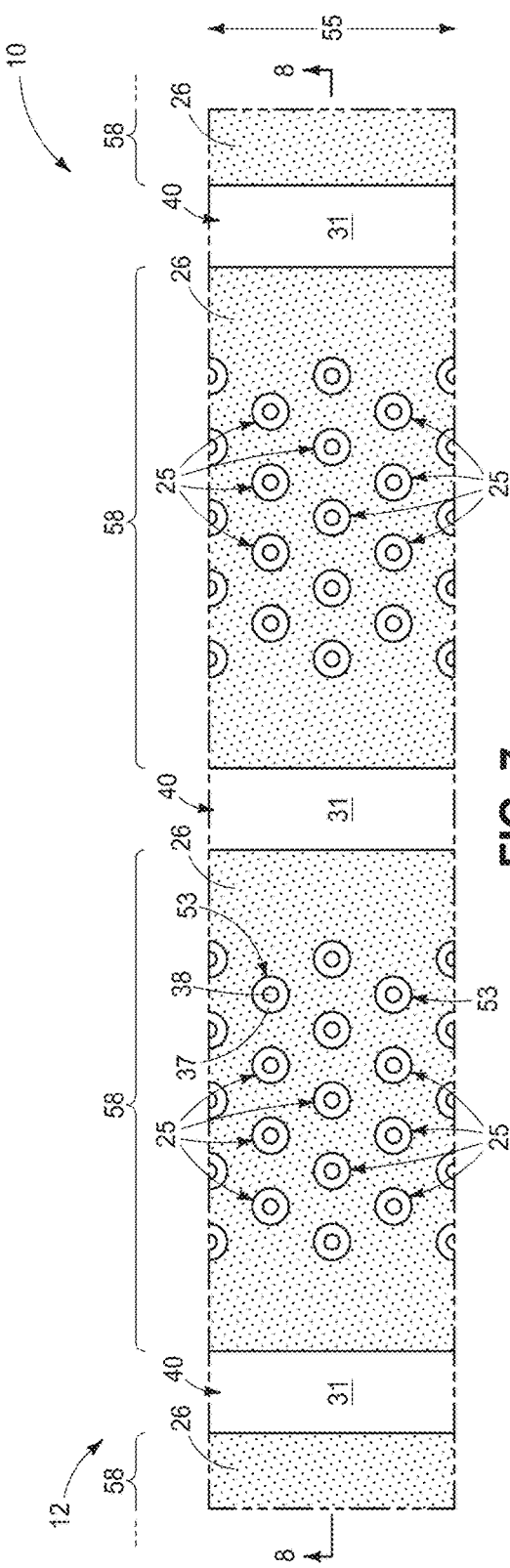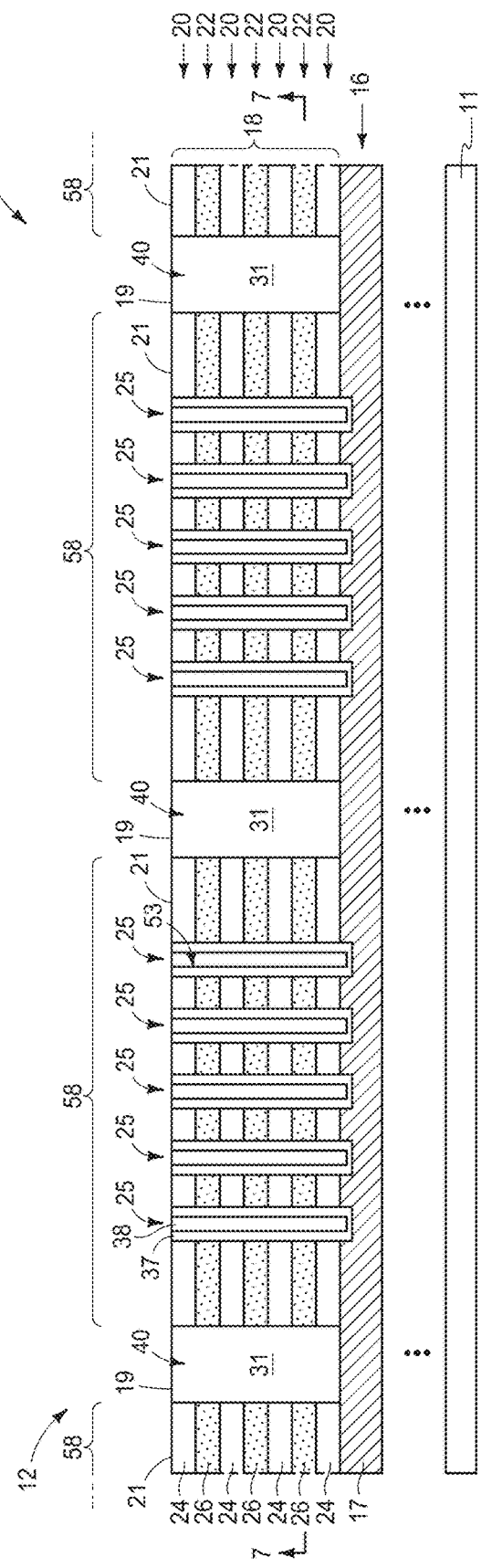

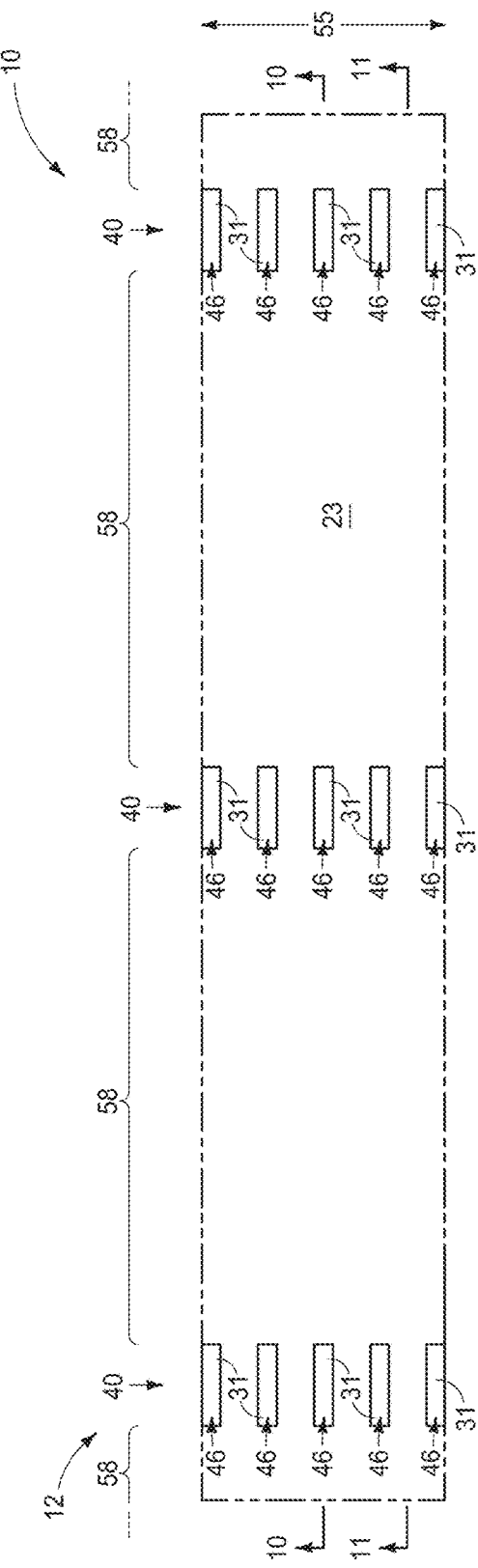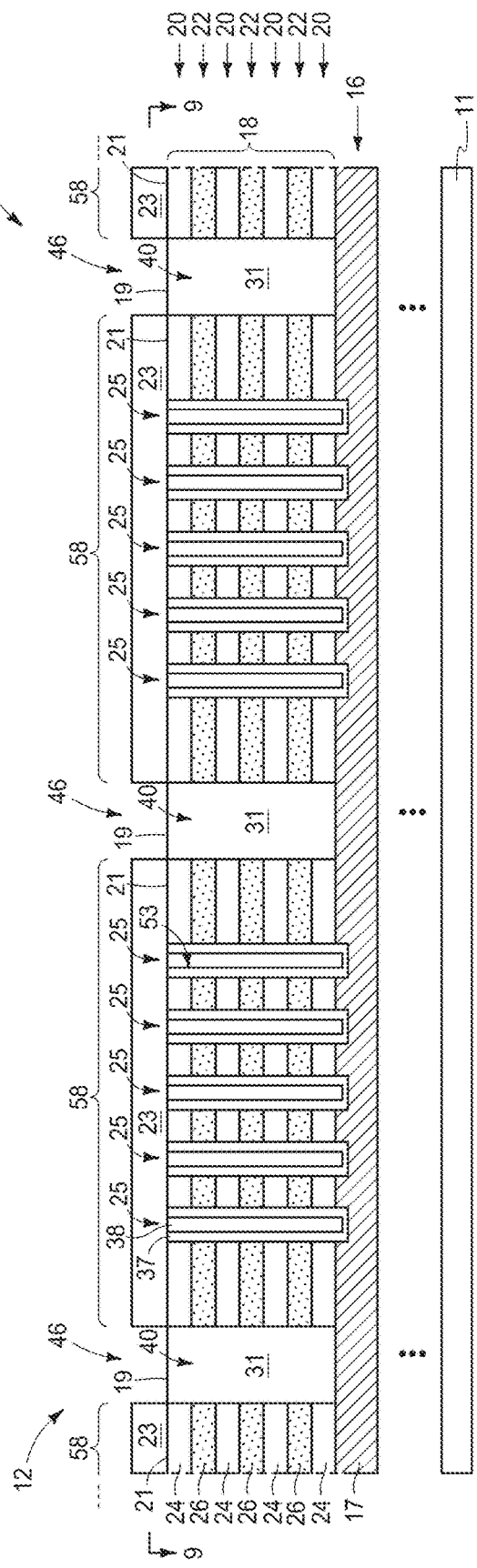

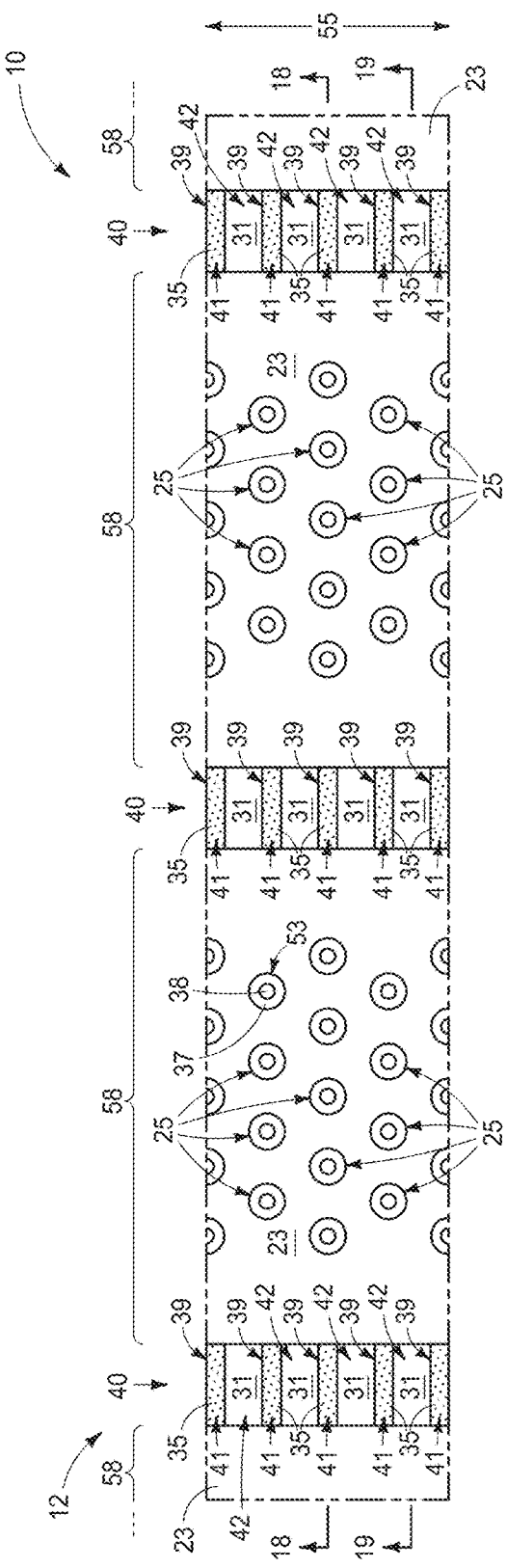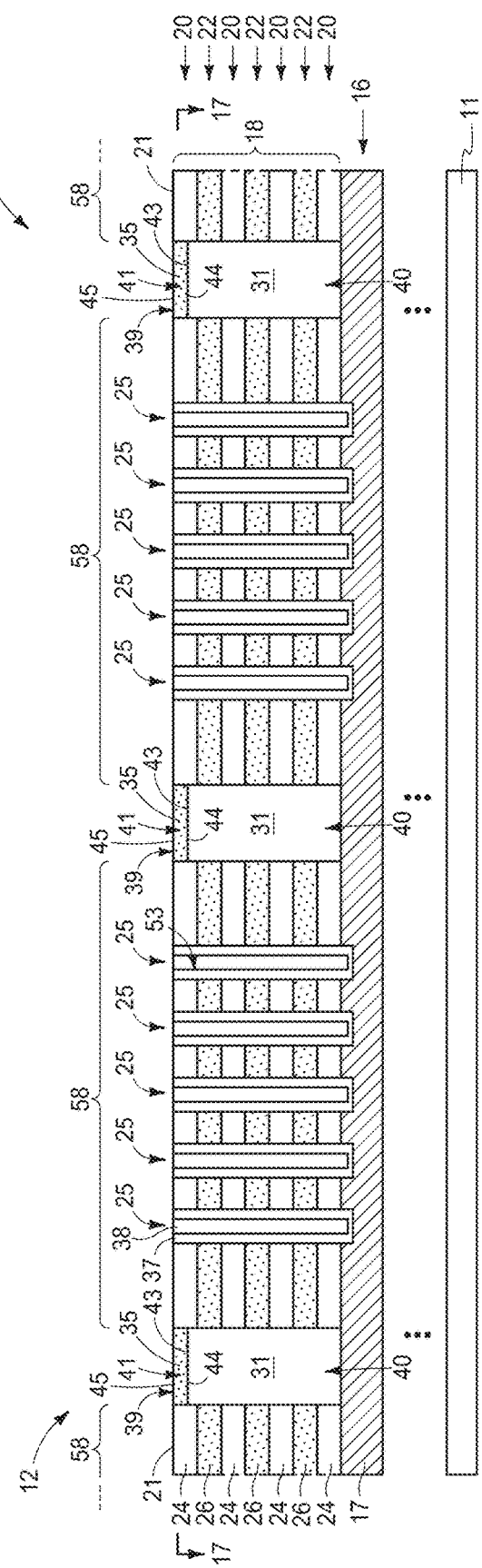
FIG. 17
FIG. 18

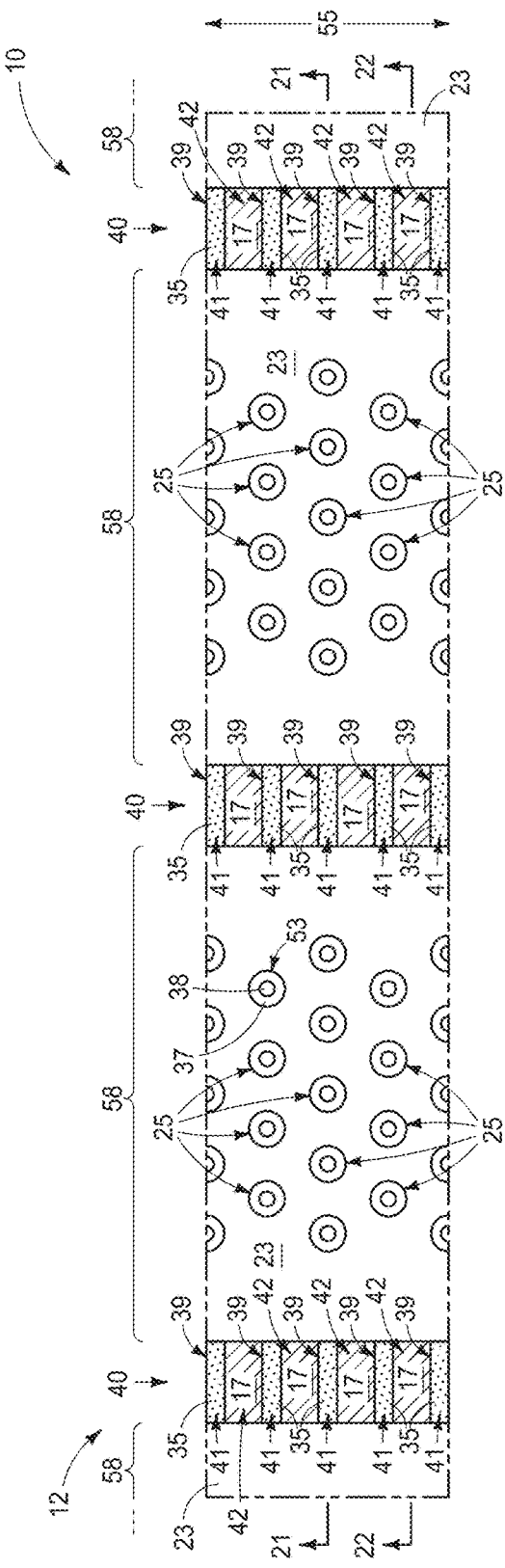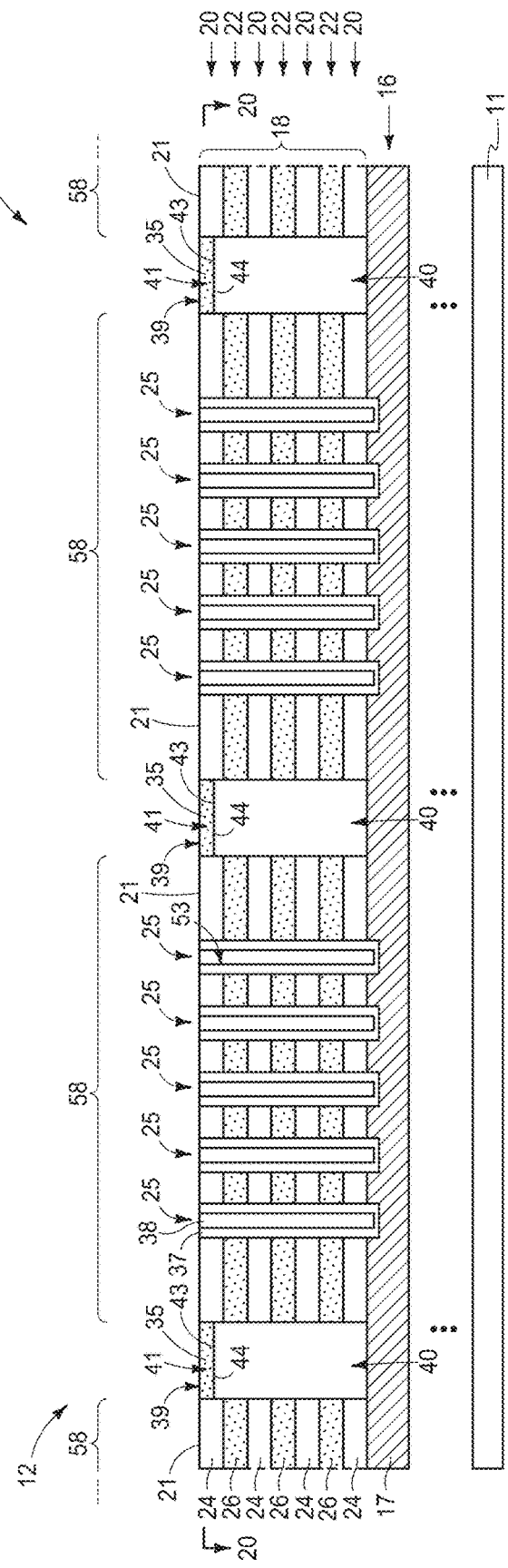

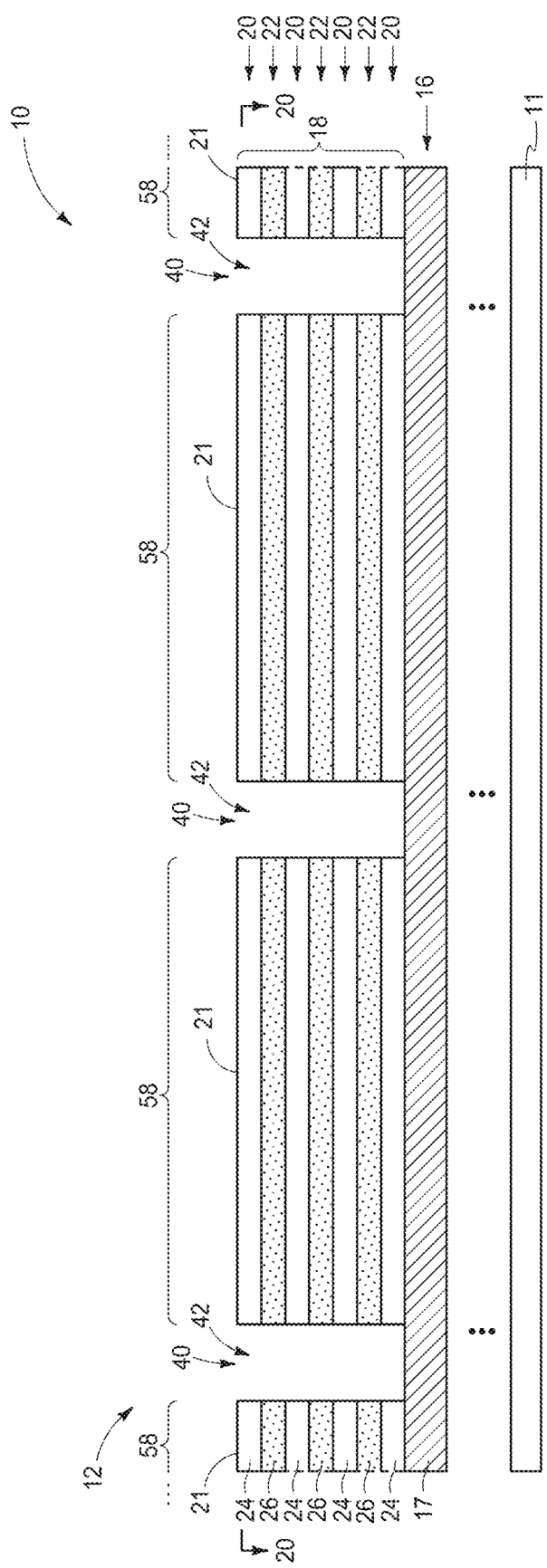

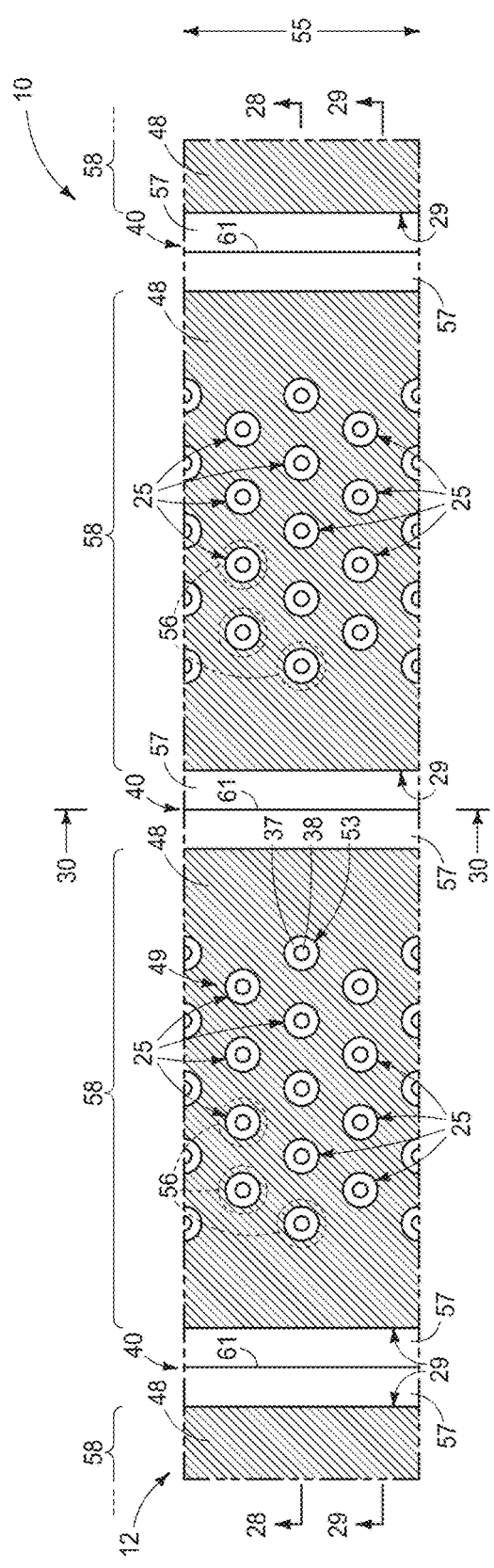
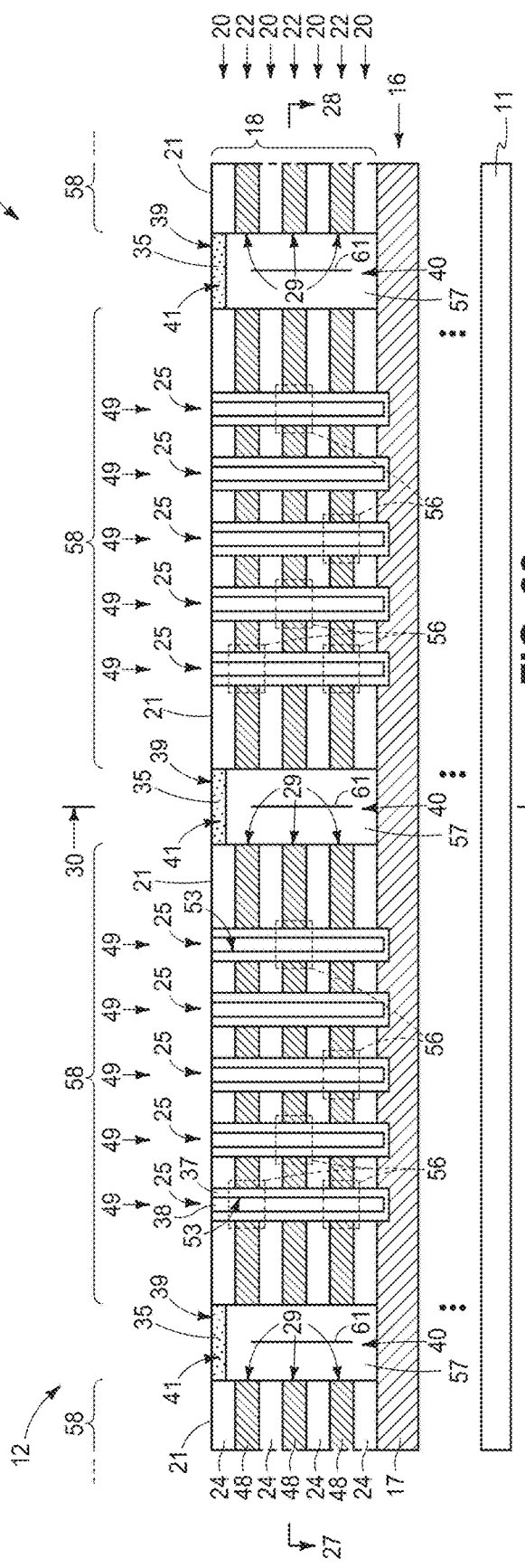

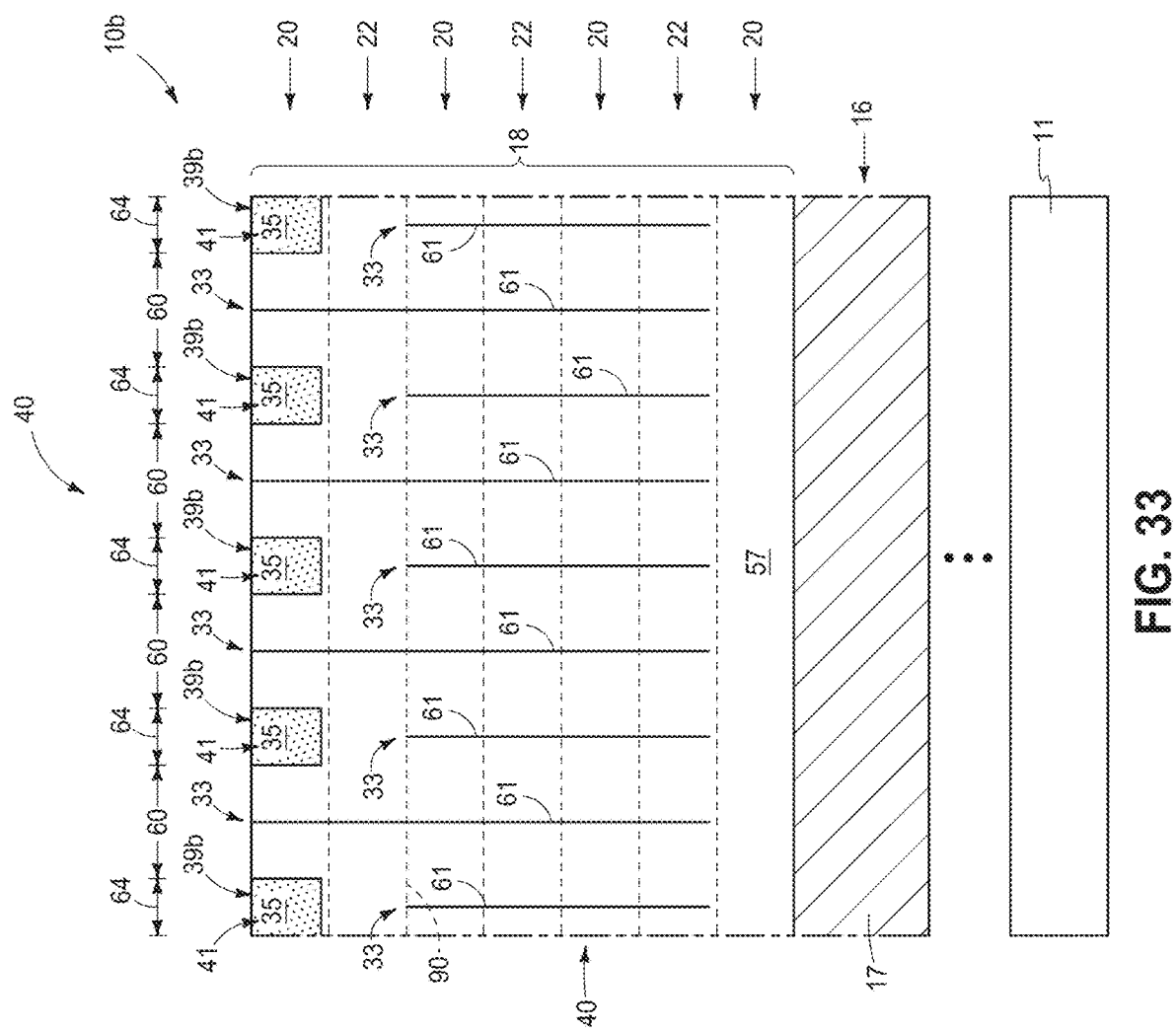

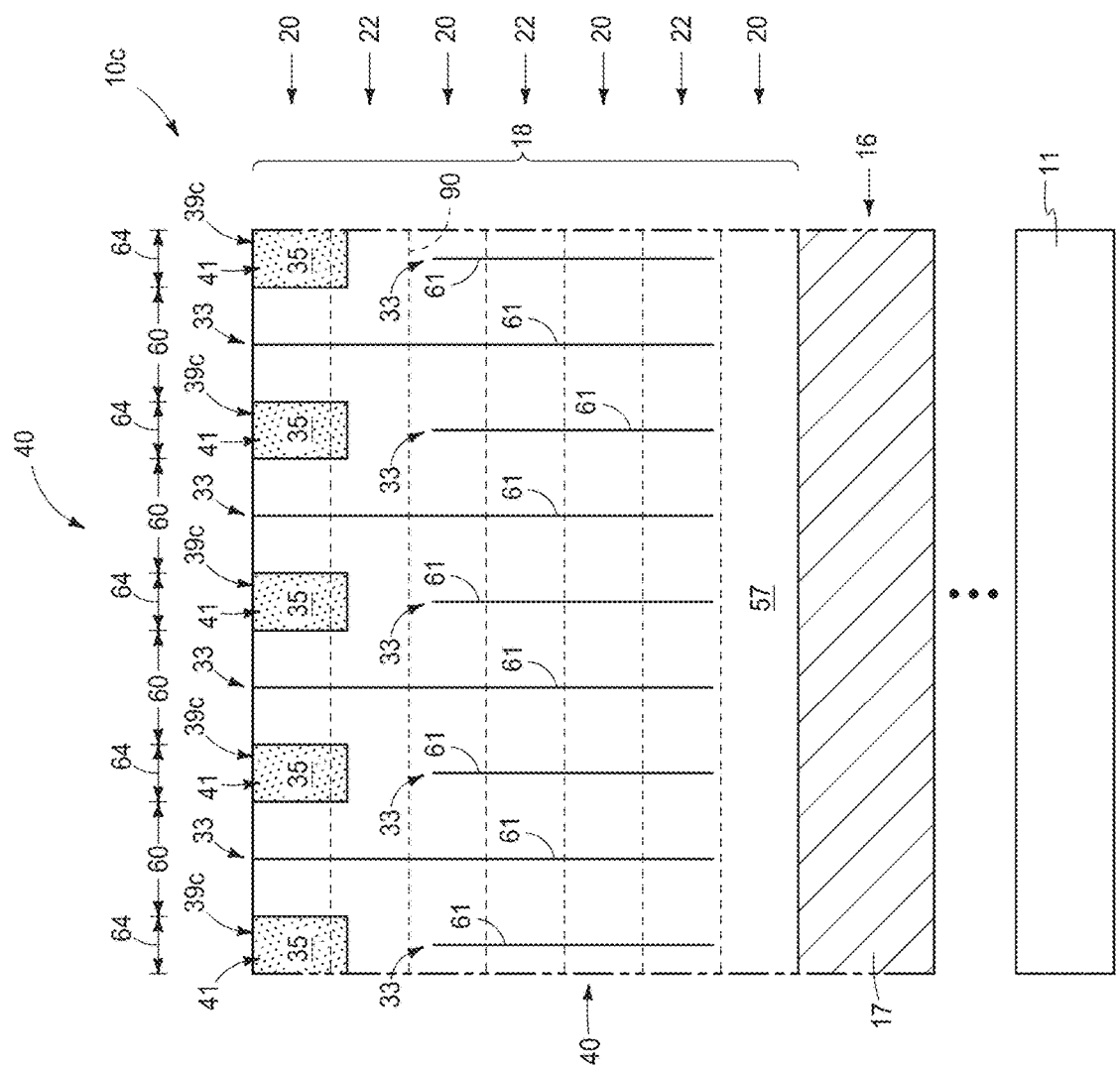

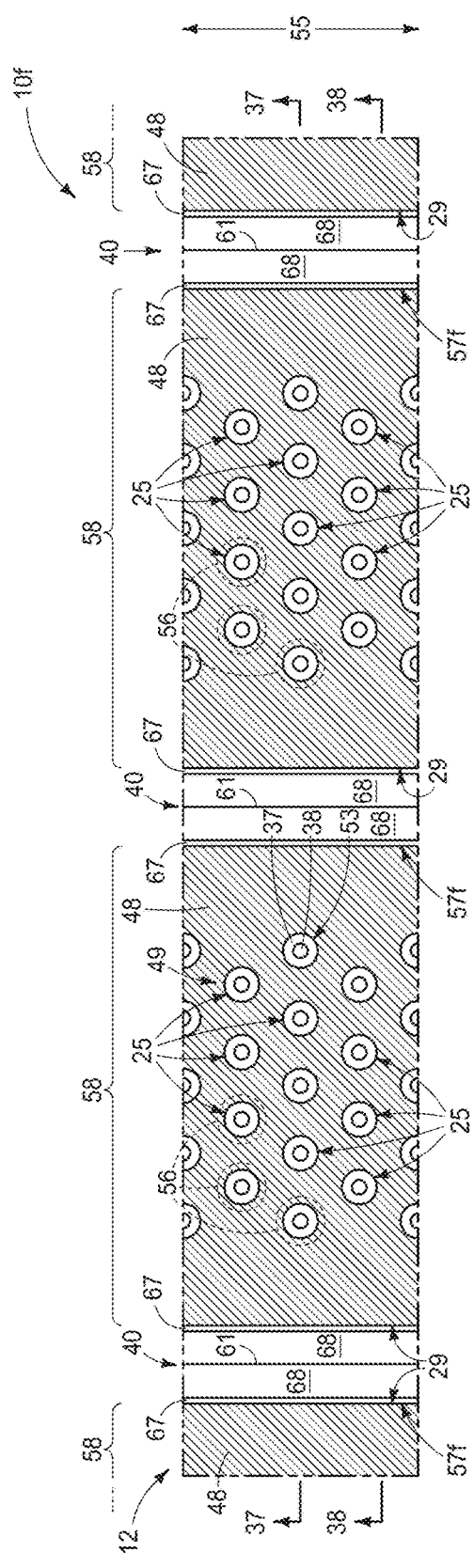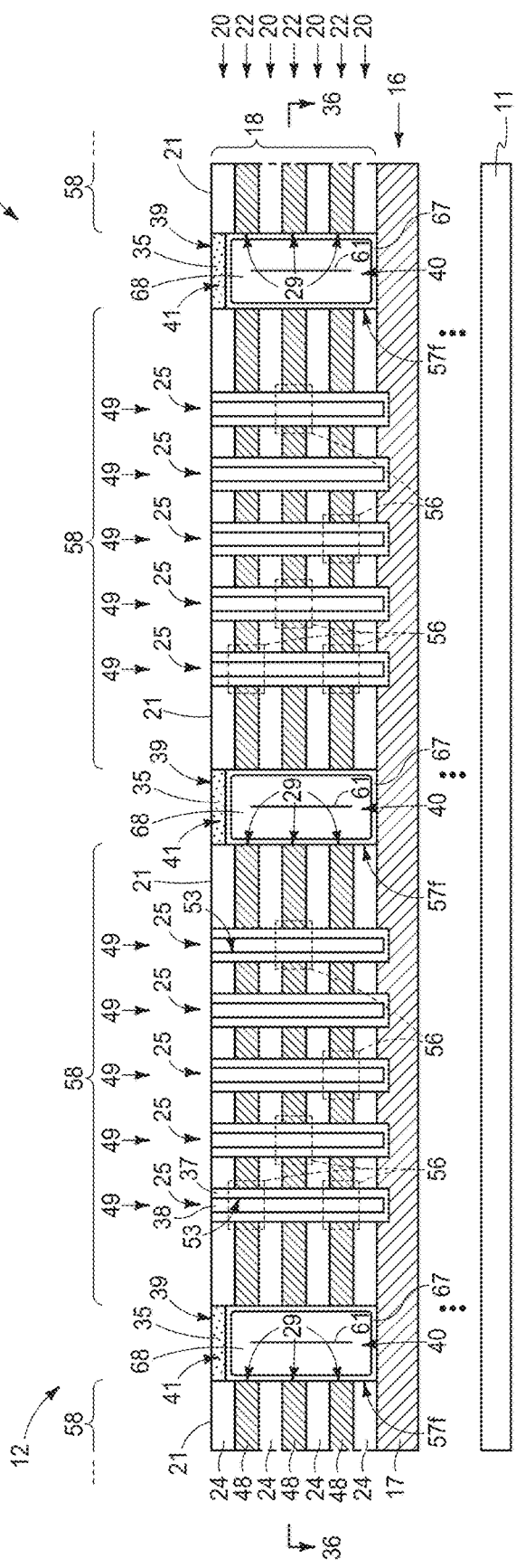
FIG. 36
FIG. 37

000

MEMORY ARRAY HAVING AN INTERVENING MATERIAL BETWEEN ADJACENT MEMORY BLOCKS WITH AN ELONGATED SEAM THEREIN

RELATED PATENT DATA

This patent resulted from a divisional application of U.S. patent application Ser. No. 16/664,618, filed Oct. 25, 2019, entitled "Methods For Manufacturing A Memory Array Having Strings Of Memory Cells Comprising Forming Bridge Material Between Memory Blocks", naming Yi Hu, Harsh Narendrakumar Jain, and Matthew J. King as inventors, the disclosure of which is incorporated by reference.

TECHNICAL FIELD

Embodiments disclosed herein pertain to memory arrays and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228659, 2016/0267984, and 2017/0140833, and which are hereby and herein fully incorporated by reference and aspects of which may be used in some embodiments of the inventions disclosed herein. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIGS. 3-31 are diagrammatic sequential sectional and/or enlarged views of the construction of FIGS. 1 and 2, or portions thereof, in process in accordance with some embodiments of the invention.

FIGS. 32-38 show alternate example method and/or structural embodiments of the invention.

DETAILED DESCRIPTION OF EXAMPLE EMBODIMENTS

Some aspects of the invention were motivated in overcoming problems associated with so-called "block-bending" (a block stack tipping/tilting sideways relative to its longitudinal orientation during fabrication), although the invention is not so limited.

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-23 which may be considered as a "gate-last" or "replacement-gate" process.

Figure 1:
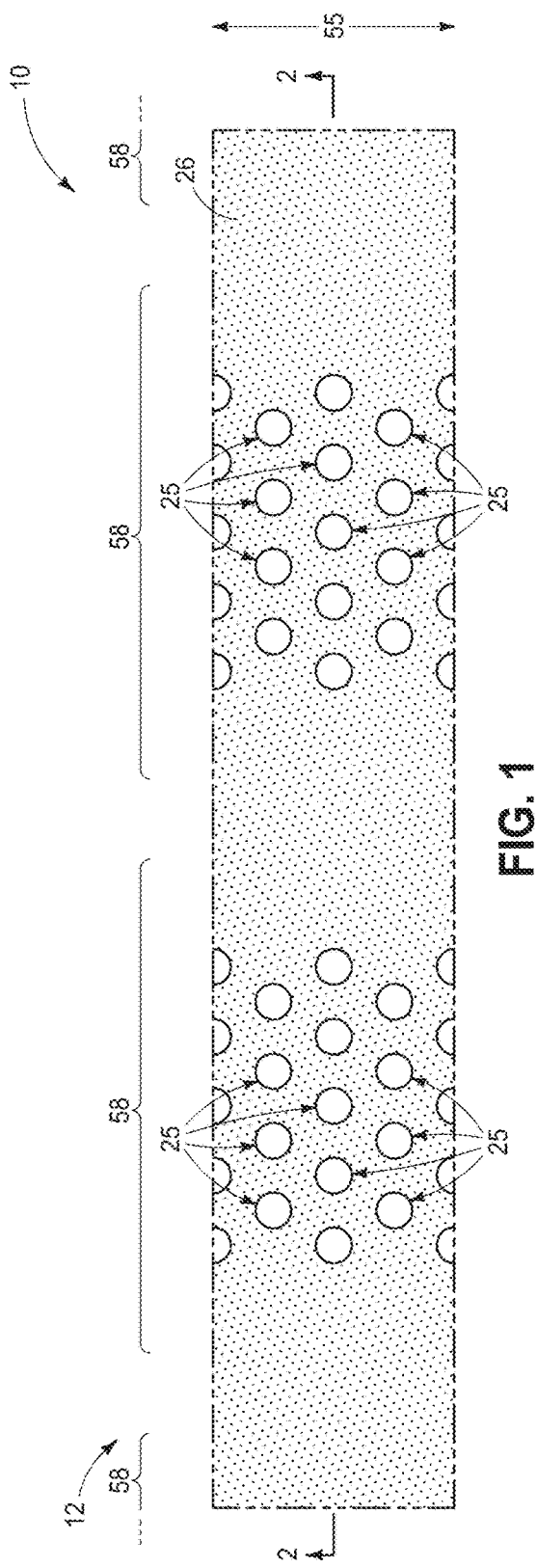
FIG. 1 is a diagrammatic cross-sectional view of a portion of a substrate in process in accordance with an embodiment of the invention and is taken through line 1-1 in FIG. 2.
Figure 2:
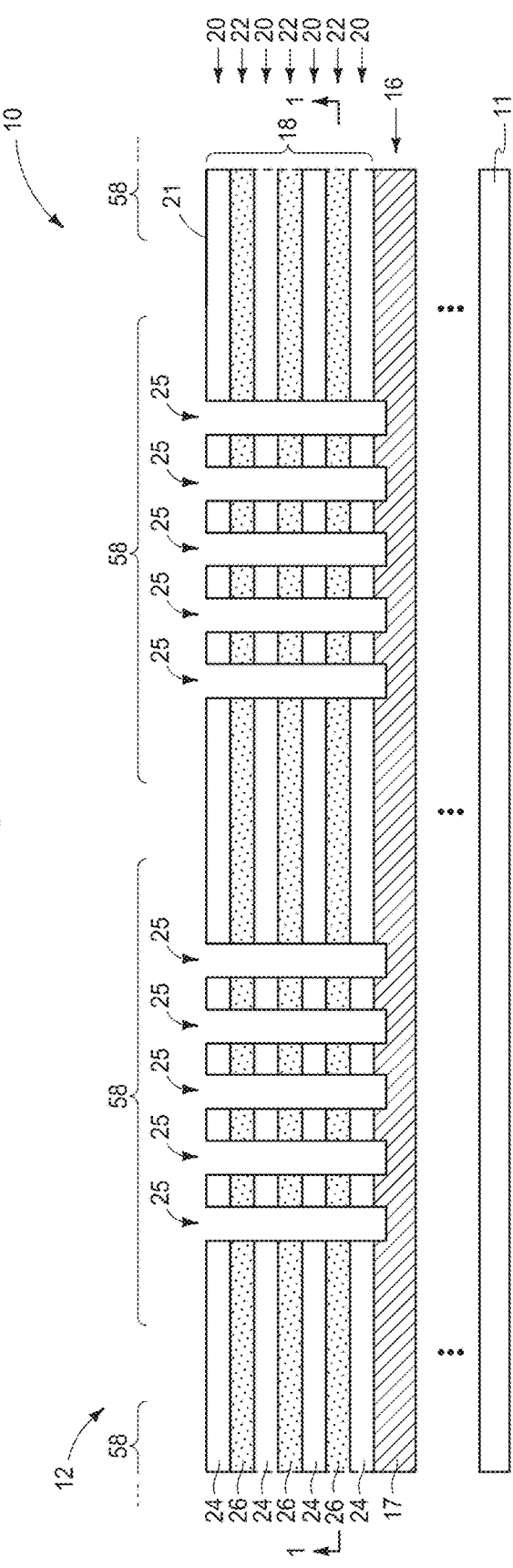
FIG. 2 is a diagrammatic cross-sectional view taken through line 2-2 in FIG. 1.
Figure 3:
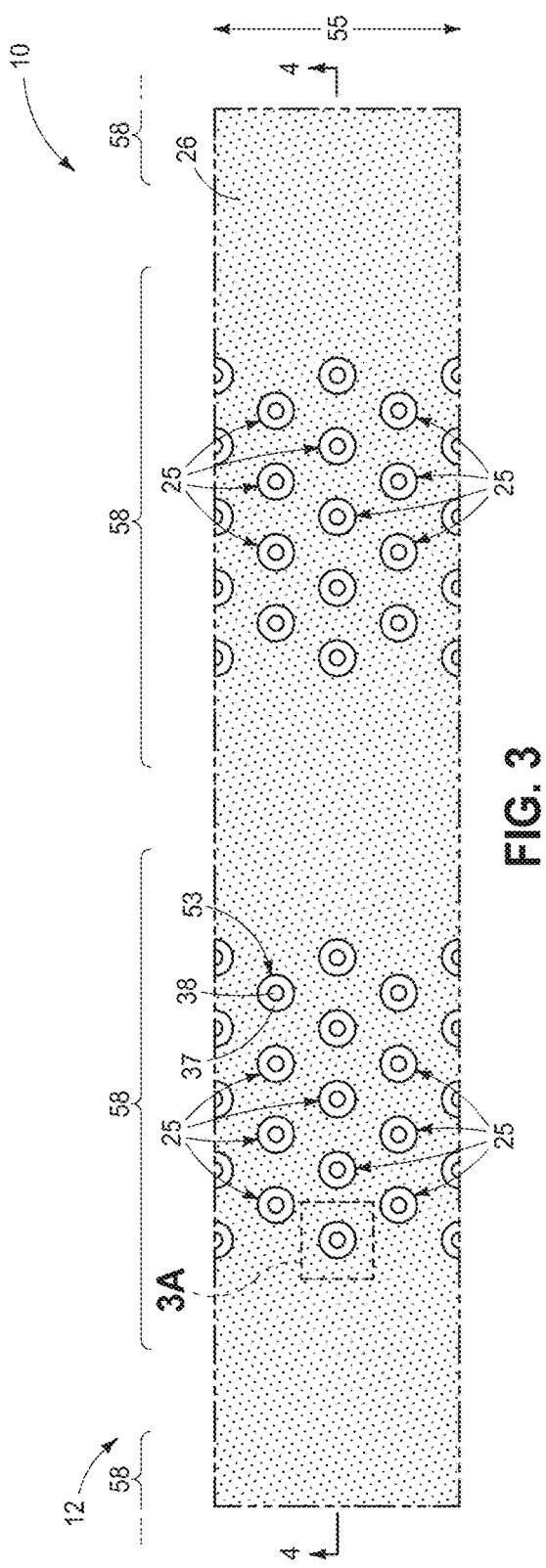
Figure 4:
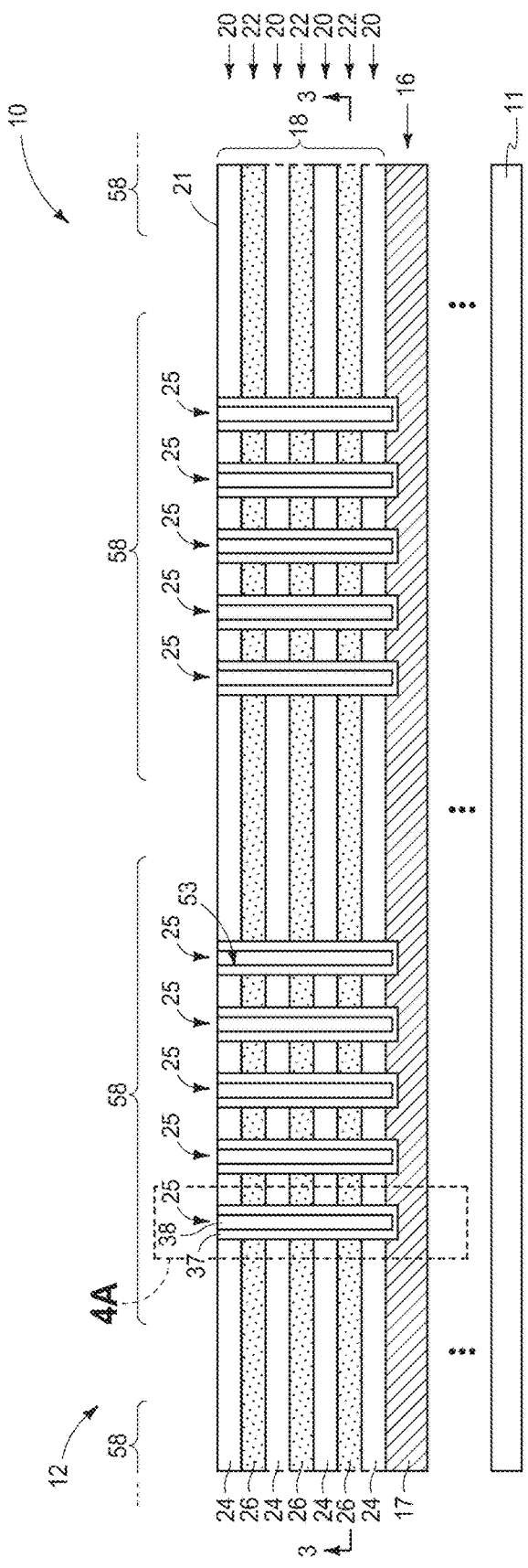

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductive material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating insulative tiers 20 and conductive tiers 22 has been formed above conductor tier 16. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22. Regardless, conductive tiers 22 (alternately referred to as first tiers) may not comprise conducting material and insulative tiers 20 (alternately referred to as second tiers) may not comprise insulative material or be insulative at this point in processing in conjunction with the hereby initially-described example method embodiment which is "gate-last" or "replacement-gate". Example conductive tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial. Uppermost insulative tier 20 may be considered as having a top surface 21.

Channel openings 25 have been formed (e.g., by etching) through insulative tiers 20 and conductive tiers 22 to conductor tier 16. In some embodiments, channel openings 25 may go partially into conductive material 17 of conductor tier 16 as shown or may stop there-atop (not shown). Alternately, as an example, channel openings 25 may stop atop or within the lowest insulative tier 20. A reason for extending channel openings 25 at least to conductive material 17 of conductor tier 16 is to assure direct electrical coupling of subsequently-formed channel material (not yet shown) to conductor tier 16 without using alternative processing and structure to do so when such a connection is desired. Etch-stop material (not shown) may be within or atop conductive material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Memory-block regions 58 may otherwise not be discernable at this point of processing. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 3, 3A, 4, and 4A show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory cell materials) may be formed by, for example, deposition of respective thin layers thereof over stack 18 and within individual channel openings 25 followed by planarizing such back at least to a top surface of stack 18. Channel material 36 has also been formed in channel openings 25 elevationally along insulative tiers 20 and conductive tiers 22, thus comprising individual operative channel-material strings 53. Materials 30, 32, 34, and 36 are collectively shown as and only designated as material 37 in FIGS. 3 and 4 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductive material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductive material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown). Conductive plugs (not shown) may be formed atop channel material strings 53 for better conductive connection to overlying circuitry (not shown).

Referring to FIGS. 5 and 6, horizontally-elongated trenches 40 have been formed (e.g., by anisotropic etching) into stack 18 to form laterally-spaced memory-block regions 58. Horizontally-elongated trenches 40 may have respective bottoms that are directly against conductive material 17 (e.g., atop or within) of conductor tier 16 (as shown) or may have respective bottoms that are above conductive material 17 of conductor tier 16 (not shown).

The above processing shows forming and filling channel openings 25 prior to forming trenches 40. Such could be reversed. Alternately, trenches 40 could be formed in between the forming and filling of channel openings 25 (not ideal).

Referring to FIGS. 7 and 8, sacrificial material 31 has been formed in trenches 40 to completely fill trenches 40. An example technique for doing so includes deposition of sacrificial material 31 to overfill trenches 40, followed by planarizing such back at least to top surface 21 of uppermost insulative tier 20. In some embodiments, such sacrificial material is referred to as second sacrificial material 31. In one embodiment and as shown, sacrificial material 31 is formed to have a top surface 19 that is elevationally coincident with top surface 21 of stack 18. In one embodiment and as shown, top surfaces 19 and 21 are individually planar and collectively co-planar. Example sacrificial materials include at least one of spin-on-carbon, boron and/or phosphorus doped silicon dioxide, silicon nitride, aluminum oxide, and elemental-form tungsten. In one embodiment, conductive tiers 22 comprise first sacrificial material 26 and sacrificial material 31 comprises a second sacrificial material which in one embodiment are of different compositions relative one another and in another embodiment are of the same composition relative one another.

Figure 11:
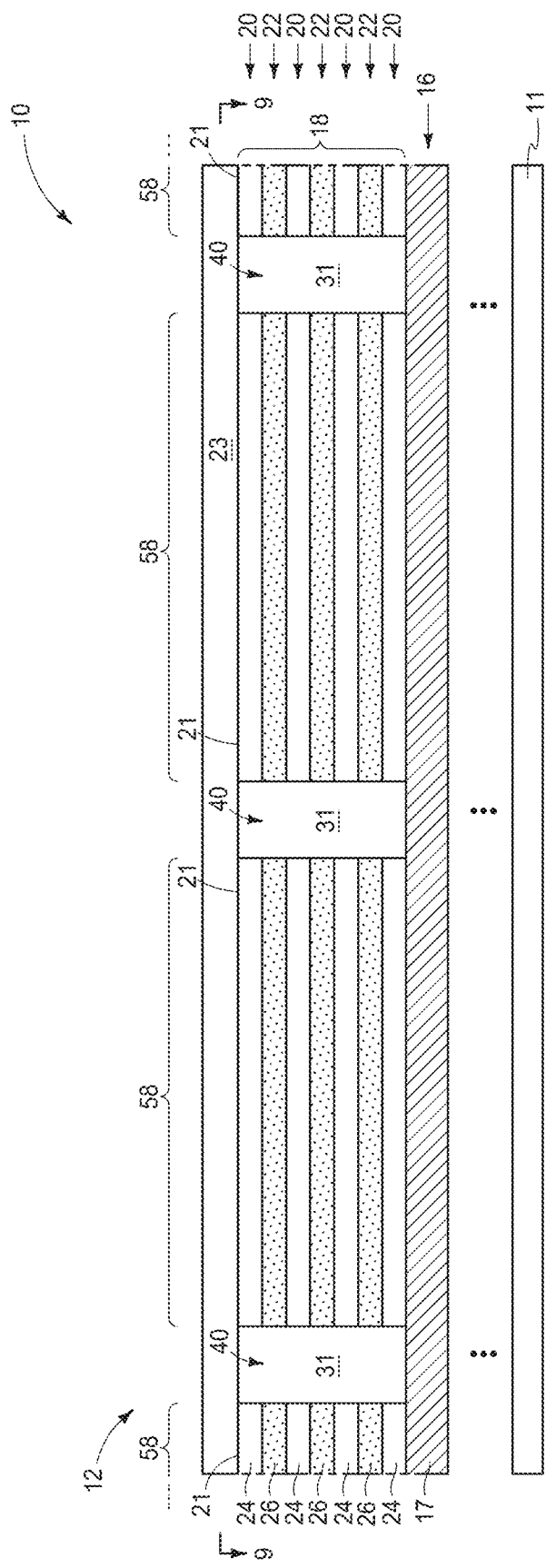

Referring to FIGS. 9-11, masking material 23 (e.g., photoresist) has been formed atop stack 18 and patterned as shown to provide longitudinally-spaced mask openings 46 there-through directly above sacrificial material 31 in trenches 40. Example patterned masking material 23 is shown as being covering in a blanketing manner over memory-block regions 58. Alternately, by way of example only, masking material 23 may be patterned as a series of horizontal lines in FIG. 9 (not shown) having trenches there-between and having a width in direction 55 the same as that of openings 46.

Figure 12:
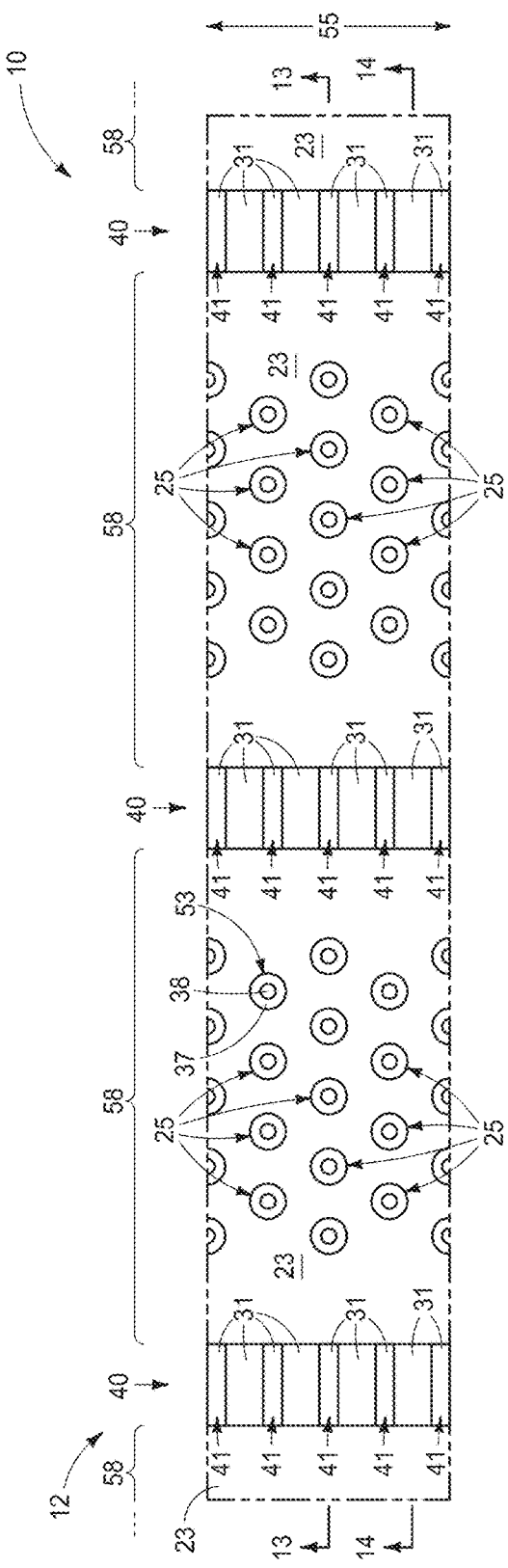
Figure 13:
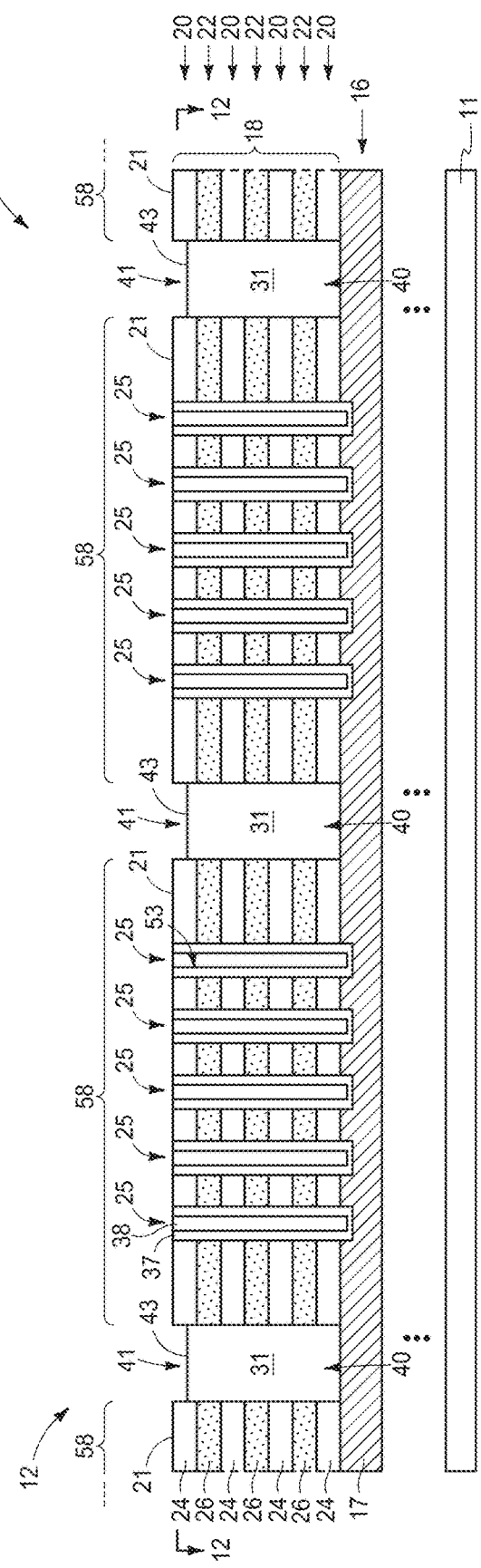
Figure 14:
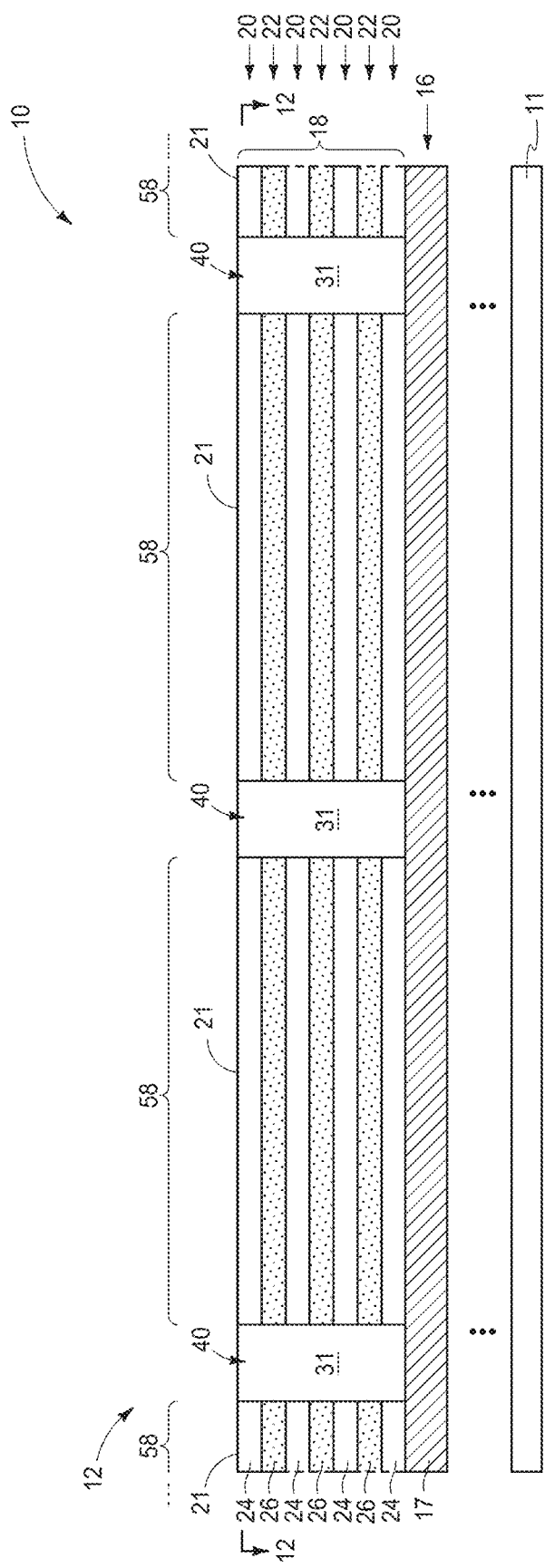

Referring to FIGS. 12-14, patterned masking material 23 (not shown) has been used in forming vertical recesses 41 in sacrificial material 31 and has then been removed. Vertical recesses 41 extend across trenches 40 laterally-between and longitudinally-spaced-along immediately-laterally-adjacent memory-block regions 58. Vertical recesses 41 individually have a bottom 43 that is below top 21 of uppermost insulative tier 20. Use of a patterned masking material 23 is but one example method by which the example vertical recesses 41 may be formed, with any alternate existing or future-developed manners being usable. Vertical recesses 41 may be formed deeper into stack 18 than shown as will be apparent in the continuing discussion.

Figure 15:
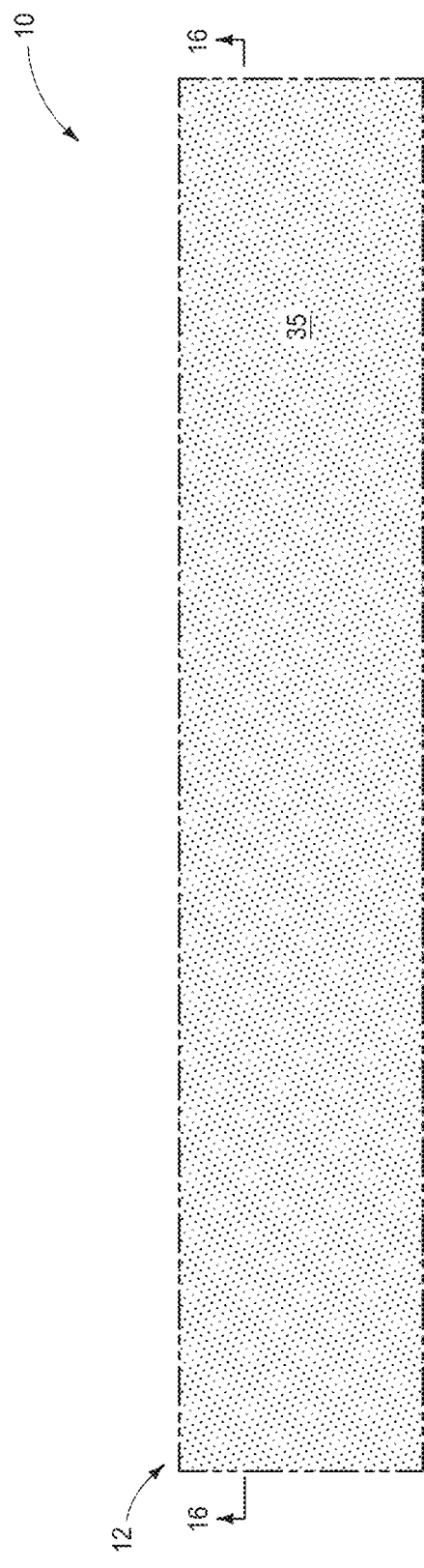
Figure 16:
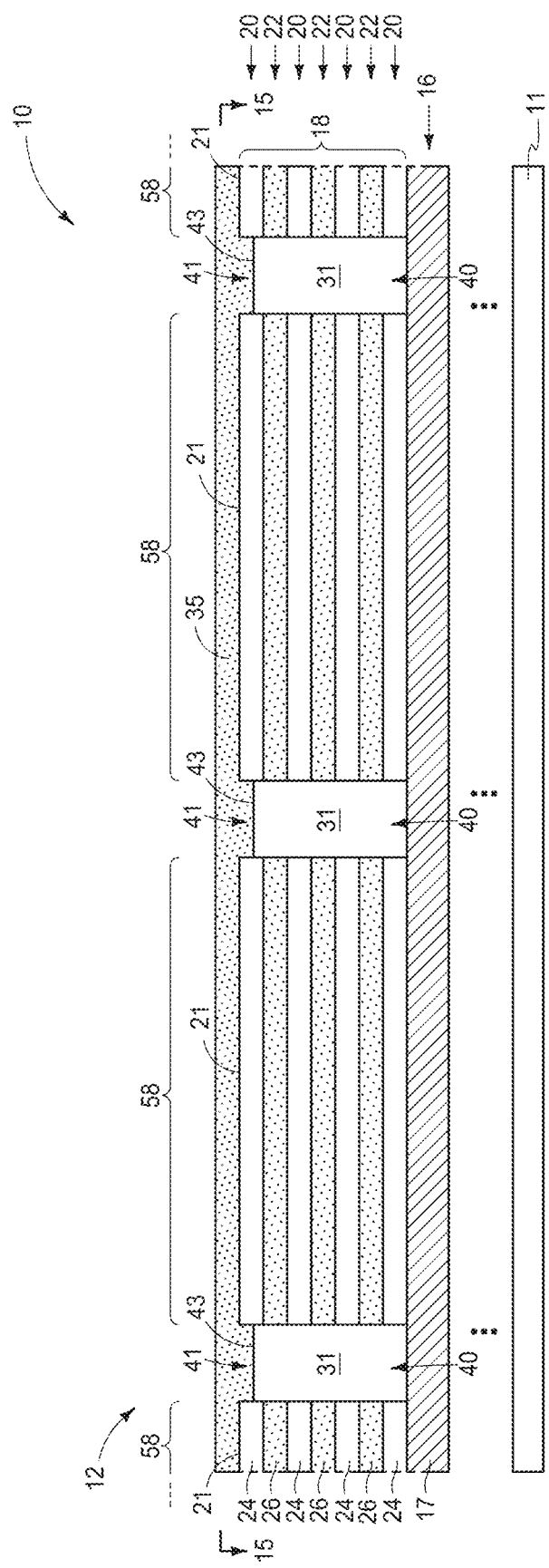

Referring to FIGS. 15 and 16, bridge material 35 has been formed in vertical recesses 41, and in one example as shown to overfill such recesses and be atop tops 21 of memory-block regions 58. In one embodiment and as shown, bridge material 35 is directly against insulative material 24 of uppermost insulative tier 20 of stack 18 and in one such embodiment is of the same composition as insulative material 24 (e.g., silicon dioxide). In another embodiment, bridge material 35 is of different composition from all material (e.g., 24, 26) of vertically-alternating insulative tiers 20 and conductive tiers 22 (regardless of whether being directly against top insulative tier 20 of stack 18), with one example material being carbon-doped silicon nitride. In embodiments where bridge material 35 remains in a finished construction of integrated circuitry, such is formed to at least have outer material thereof be insulative (whereby bridges 39 formed therefrom are thereby insulative).

Figure 19:
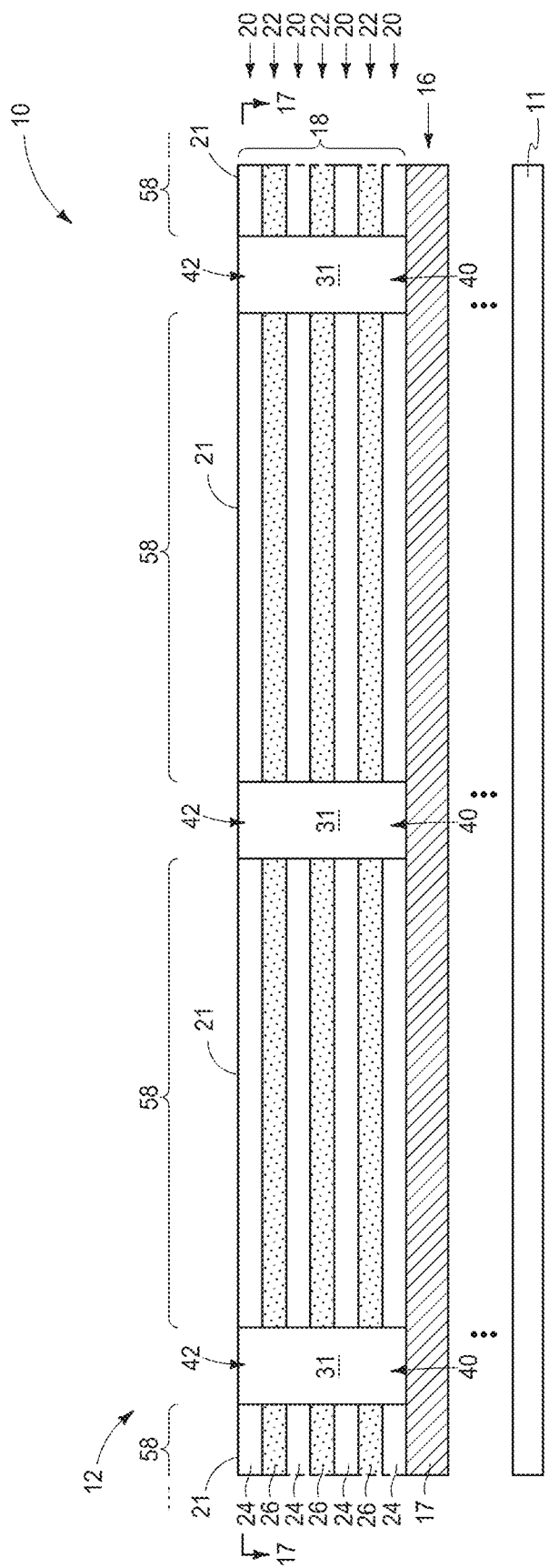
Figure 23:
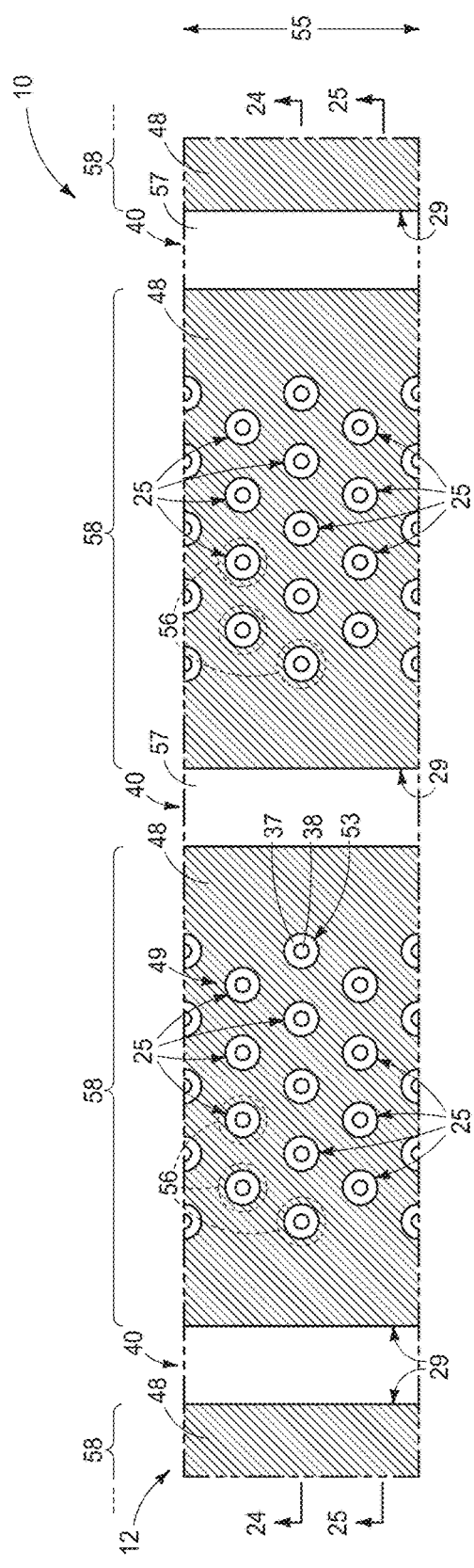
Figure 24:
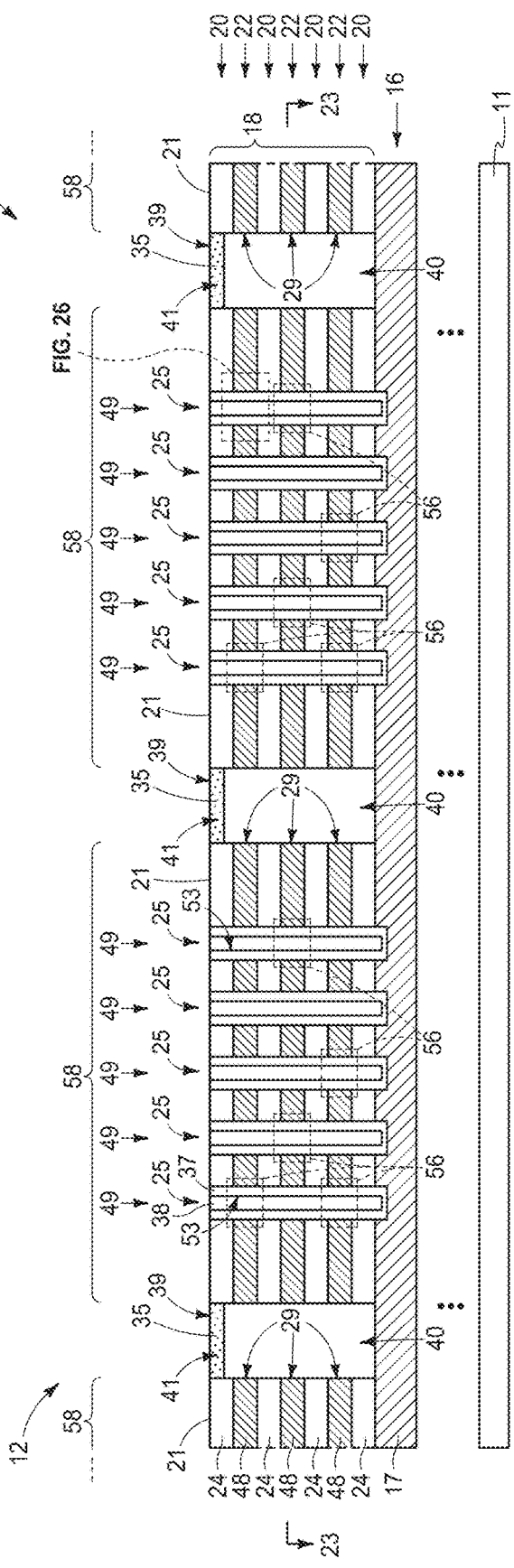
Figure 25:
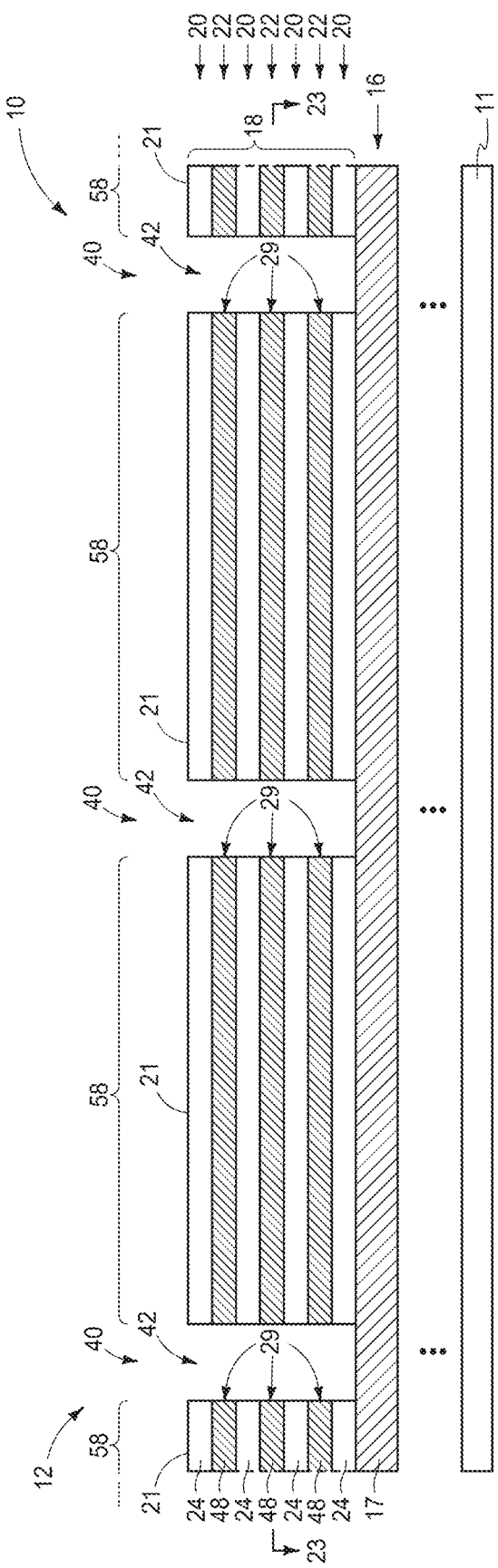
Figure 26:
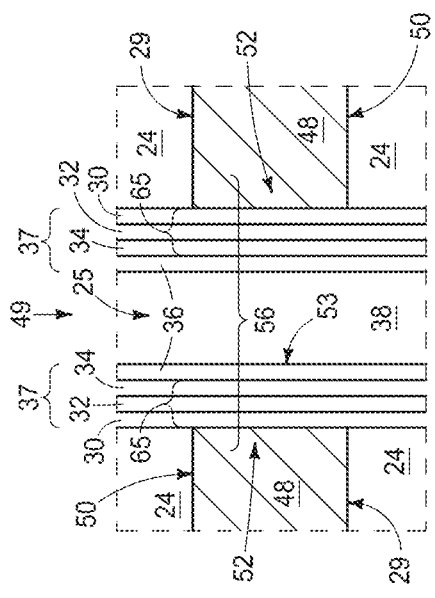
Figure 29:
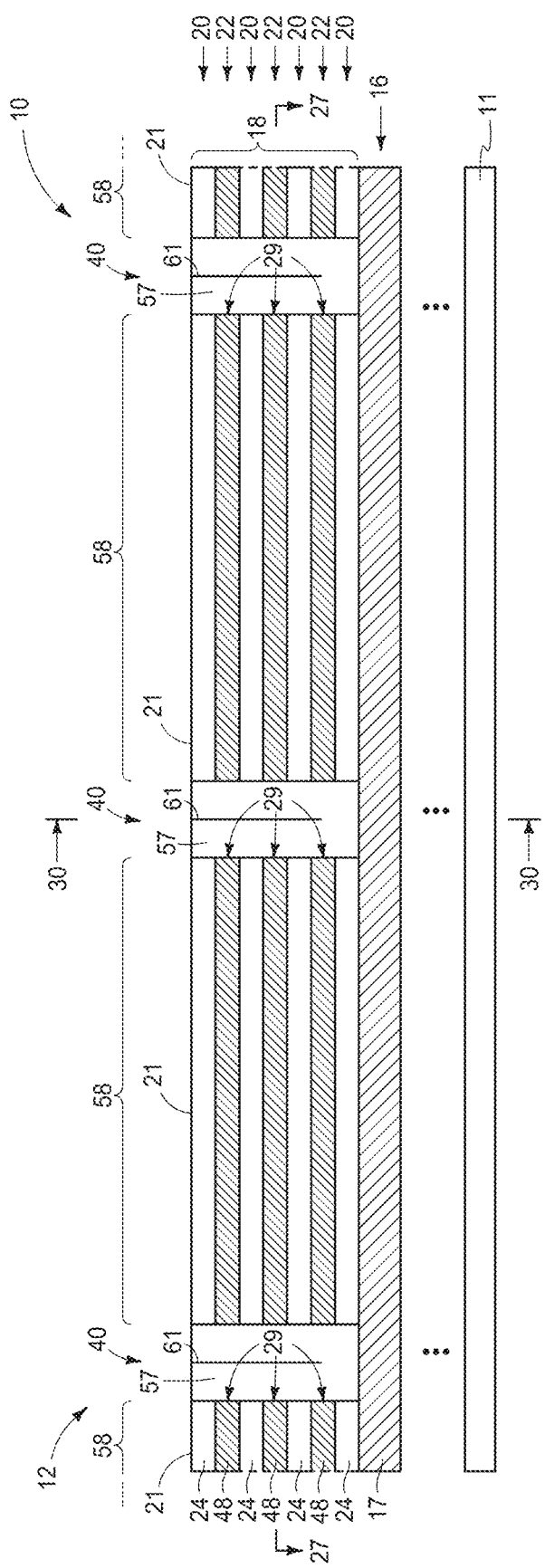

Referring to FIGS. 17-19, bridge material 35 has been planarized back (e.g., by polishing) at least to tops 21 of outermost insulative tier 20 to form bridges 39 that extend across trenches 40 laterally-between and longitudinally-spaced-along immediately-laterally-adjacent memory-block regions 58. The planarizing back of bridge material 35 may be conducted to inherently stop on sacrificial material 31, for example such providing a hard-stop if material 31 comprises carbon. Example bridges 39 individually have a bottom 44 that is below top 21 of uppermost insulative tier 20 and individually have a planar top 45 that is co-planner with old or new top 21 of uppermost insulative tier 20. Spaces 42 are longitudinally-between bridges 39 and occupied by sacrificial material 31. Bridges 39 in one embodiment are insulative, which includes/encompasses any combination of bridge materials at least the outermost layer or portion of which is insulative.

Sacrificial material 31 in trenches 40 is replaced with intervening material that is directly under and longitudinally-between bridges 39. An example such method is first described with reference to FIGS. 20-31. Referring first to FIGS. 20-22, sacrificial material 31 (not shown) has been removed, for example by being isotropically etched away selectively relative to bridges 39 and insulative tiers 20, and in one embodiment as shown selectively relative to conductive tiers 22. The artisan is capable of selecting suitable etching chemistries for etching one material selectively relative to other materials. In one embodiment and as shown, all remaining sacrificial material 31 has been removed in the processing of FIGS. 20-22.

Referring to FIGS. 23-26, and in one embodiment, material 26 (not shown) of conductive tiers 22 has been removed, for example by being isotropically etched away through spaces 42 ideally selectively relative to the other exposed materials (e.g., using liquid or vapor $H_3PO_4$ as a primary etchant where material 26 is silicon nitride, and other materials comprise one or more oxides or polysilicon). Material 26 (not shown) in conductive tiers 22 in the example embodiment is sacrificial and has been replaced with conducting material 48, and which has thereafter been removed from spaces 42 and trenches 40, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of transistors and/or memory cells 56 are indicated with a bracket in FIG. 26 and some with dashed outlines in FIGS. 23 and 24, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 26) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming bridges 39. Alternately, the conducting material of the conductive tiers may be formed before forming upper bridges 39 and/or before forming trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Figure 31:
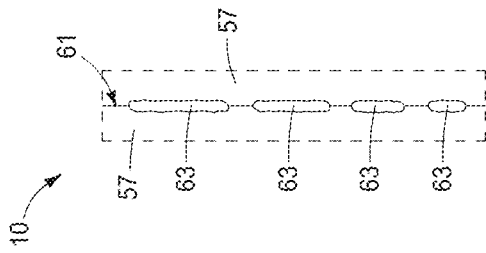
Figure 30:
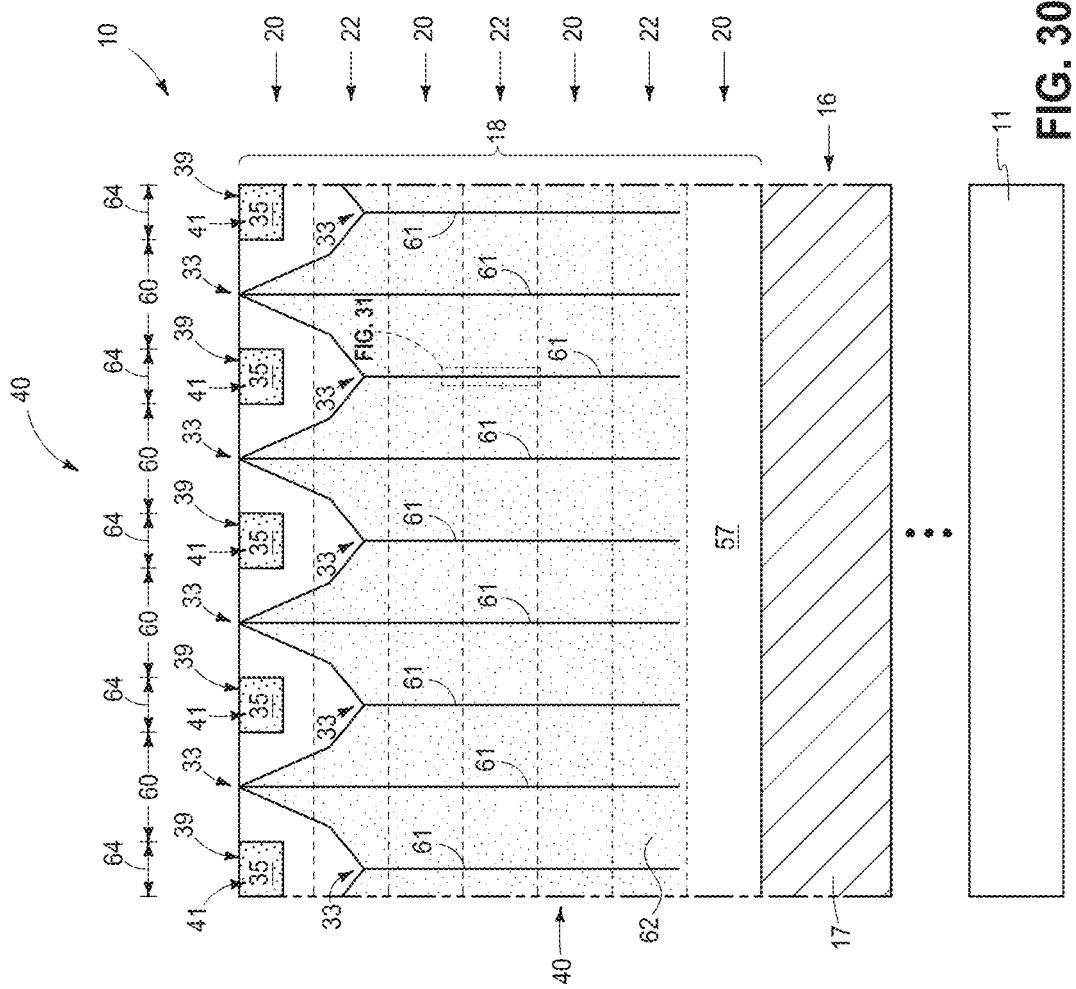

Referring to FIGS. 27-31, and in one embodiment, intervening material 57 has been formed in trenches 40 directly under and longitudinally-between bridges 39 between immediately-laterally-adjacent memory-block regions 58. FIG. 30 is at a scale three-times enlarged to that of FIGS. 27-29 for clarity, and FIG. 31 is a diagrammatic enlargement of a portion of FIG. 30. Intervening material 57 may provide lateral electrical isolation (insulation) between immediately-laterally-adjacent memory-block regions 58 and ultimate memory blocks 58. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. In one embodiment, intervening material 57 comprises a laterally-outermost insulative material (e.g., silicon nitride and/or silicon dioxide and not shown) and a laterally-inner material (e.g., undoped polysilicon and not shown) of different composition from that of the laterally-outermost insulative material. In one such embodiment, the laterally-inner material is insulative. In one embodiment, intervening material 57 is everywhere insulative between the immediately-laterally-adjacent memory blocks.

Figure 32:
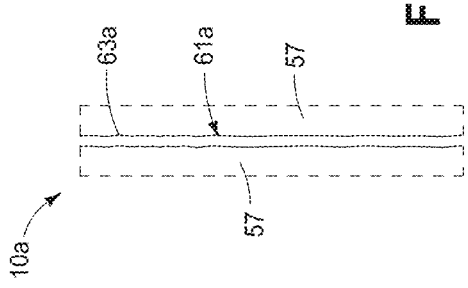

In one embodiment, intervening material 57 comprises a vertically-elongated seam therein. Seam area 62 (shaded) illustrates a cross-sectional view of the seam within the trench 40. Intervening material 57 may be considered as comprising longitudinally-alternating first and second regions 60 and 64, respectively. In one embodiment and as shown, the vertically-elongated seam includes a number of seam regions 61 that are taller longitudinally-between bridges 39 than directly under bridges 39. Alternately or additionally, and as shown, vertically-elongated seam regions 61 have a seam top 33 (FIG. 30) that is higher longitudinally-between bridges 39 than directly under bridges 39. In one embodiment, vertically-elongated seam comprises at least one void space and in one such embodiment and as shown (FIG. 31) comprises multiple vertically-spaced void spaces 63. At least some of multiple void spaces 63 individually may be vertically-elongated, for example as shown. In another example embodiment, a vertically-elongated seam region 61*a* comprises only one void space 63*a* (e.g., extending downwardly from the top of intervening material 57 in trenches 40) as shown with respect to a construction 10*a* in FIG. 32. Like numerals from the above-described embodiments have been used where appropriate, with some construction differences being indicated with the suffix "a". Any other attribute(s) or aspect(s) as shown and/or described herein with respect to other embodiments may be used.

Bridges 39 may be vertically thinner or thicker than shown. For example, FIG. 33 shows an alternate construction 10*b* having thicker bridges 39*b* than shown in FIG. 30. Like numerals from the above-described embodiments have been used where appropriate, with some construction differences being indicated with the suffix "b". In some embodiments, the seam tops in the second regions are elevationally-coincident with or below a bottom of an uppermost of the conductive tiers. FIG. 33 shows an example where seam tops 33 in second regions 64 are elevationally-coincident with a bottom 90 of the uppermost conductive tier 22. FIG. 34 shows an alternate construction 10*c* to that of FIGS. 30 and 33 and having bridges 39*c*. Like numerals from the above-described embodiments have been used where appropriate, with some construction differences being indicated with the suffix "c". Seam tops 33 in second regions 64 in FIG. 34 are below bottom 90 of the uppermost conductive tier 22. Any other attribute(s) or aspect(s) as shown and/or described herein with respect to other embodiments may be used in the embodiments shown and described with reference to FIGS. 33 and 34.

Figure 35:
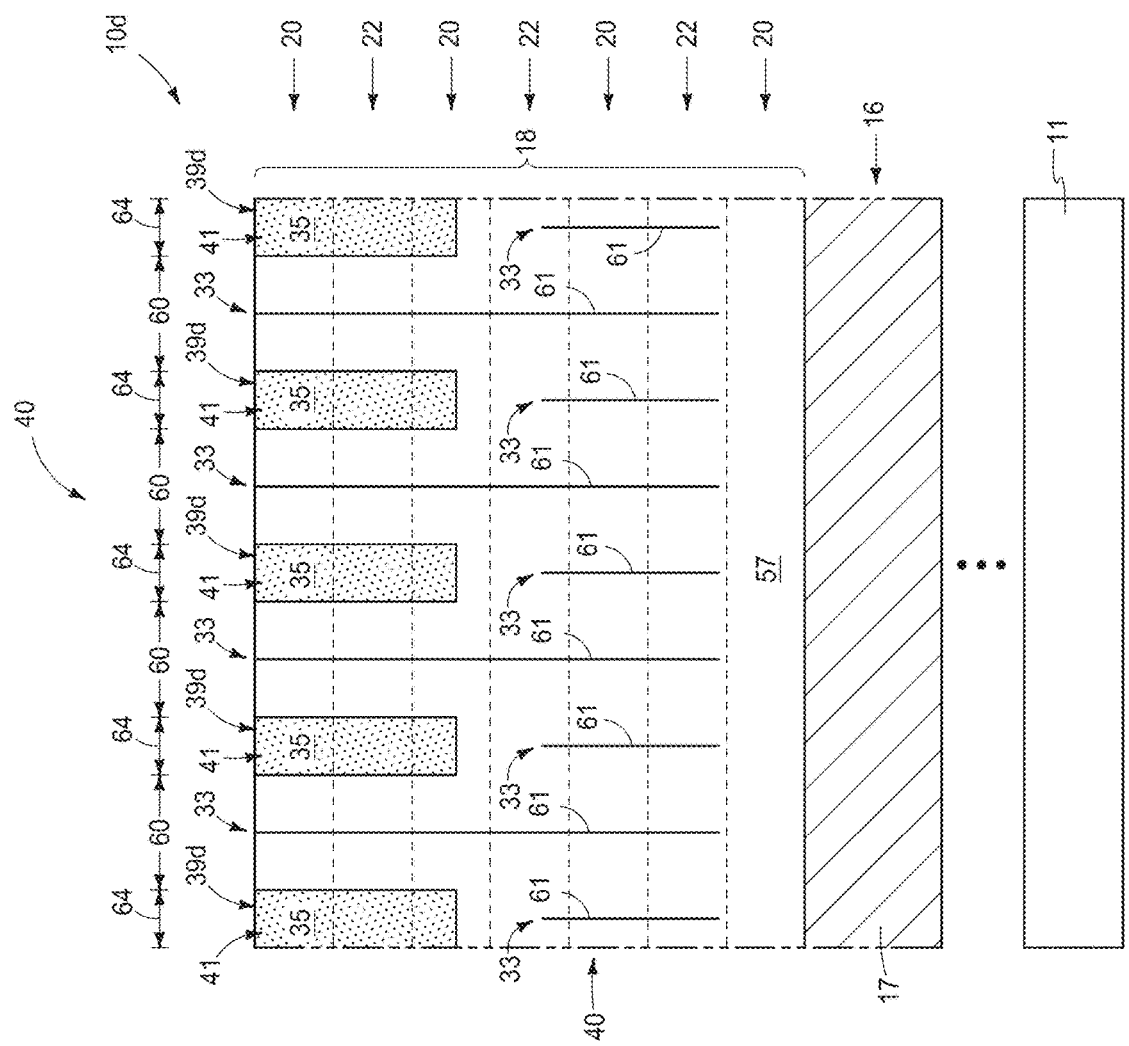

FIGS. 27-30, 33, and 34 show example embodiments where seam tops 33 in second regions 64 are in an uppermost half of stack 18. Alternately, such seam tops could be exactly at an interface between uppermost and lowest halves of stack 18 or in a lowest half of the stack. FIG. 35 shows an example construction 10*d* having bridges 39*d* where seam tops 33 in second regions 64 are in the lowest half of stack 18. Any other attribute(s) or aspect(s) as shown and/or described herein with respect to other embodiments may be used.

Figure 38:
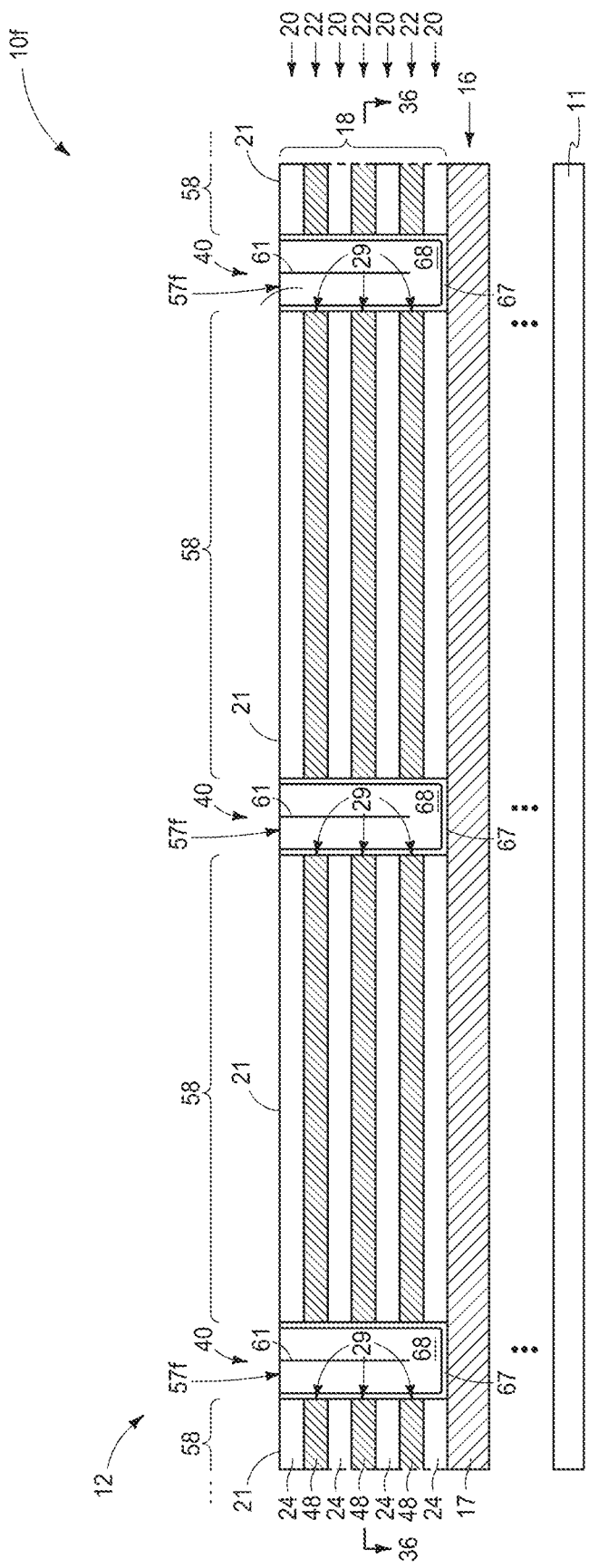

An alternate example method and resultant construction 10*f* are shown and described with reference FIGS. 36-38. Like numerals from the above-described embodiments have been used where appropriate, with some construction differences being indicated with the suffix "f" or with different numerals. FIGS. 36-38 show an example embodiment where the intervening material between the memory blocks/block regions is not homogenous. Specifically, example intervening material 57*f* has been formed to comprise a laterally-outer material 67 and a laterally-inner material 68 of different composition from that of laterally-outer material 67. Vertically-elongated seam 61 is in laterally-inner material 68. By way of examples only, an example laterally-outer material 67 comprises silicon dioxide and an example laterally-inner material 68 comprises undoped polysilicon. Any other attribute(s) or aspect(s) as shown and/or described herein with respect to other embodiments may be used.

In one embodiment where bridges 39/39*b*/39*c*/39*d* are insulating/insulative, at least some insulative material thereof is of the same composition as intervening material 57/57*f*. In one embodiment where bridges 39/39*b*/39*c*/39*d* are insulating/insulative, at least some insulative material thereof is of different composition from that of intervening material 57/57*f*, and in one embodiment only some insulative material thereof is of different composition from that of intervening material 57/57*f*.

In some method embodiments, all of the bridges are removed at some time after replacing the sacrificial material in the trenches with intervening material that is directly under and longitudinally between the bridges (not shown). Alternately, at least some material of the bridges may remain extending across the trenches in a finished construction of the memory array including, for example, vertical thickness of the bridges (not shown) being reduced sometime after the act of forming the bridge material, and for example whereby at least some material of the bridges remains extending across the trenches in a finished construction of the memory array.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

Embodiments of the invention include a memory array (e.g., 12) comprising strings (e.g., 49) of memory cells (e.g., 56). The memory array comprises laterally-spaced memory blocks (e.g., 58) individually comprising a vertical stack (e.g., 18) comprising alternating insulative tiers (e.g., 20) and conductive tiers (e.g., 22). Operative channel-material strings (e.g., 53) of memory cells extend through the insulative tiers and the conductive tiers. Intervening material (e.g., 57, 57*f*) is laterally-between and longitudinally-along immediately-laterally-adjacent of the memory blocks. The intervening material comprises longitudinally-alternating first and second regions (e.g., 60 and 64, respectively) individually having a vertically-elongated seam therein (e.g., 61, 61*a*). The vertically-elongated seam in the first regions has a higher seam top (e.g., 33) than in the second regions. The seam tops in the second regions are elevationally-coincident with or below a bottom (e.g., 90) of an uppermost of the conductive tiers. Any other attribute(s) or aspect(s) as shown and/or described herein with respect to other embodiments may be used.

Embodiments of the invention include a memory array (e.g., 12) comprising strings (e.g., 49) of memory cells (e.g., 56). The memory array comprises laterally-spaced memory blocks (e.g., 58) individually comprising a vertical stack (e.g., 18) comprising alternating insulative tiers (e.g., 20) and conductive tiers (e.g., 22). Operative channel-material strings (e.g., 53) of memory cells extend through the insulative tiers and the conductive tiers. Intervening material (e.g., 57, 57*f*) is laterally-between and longitudinally-along immediately-laterally-adjacent of the memory blocks. The intervening material comprising a vertically-elongated seam therein (e.g., 61, 61*a*) that has a seam top (e.g., 33) that is elevationally-coincident with (i.e., somewhere between the top and the bottom of the uppermost insulative tier, inclusive of said top and bottom) or below an uppermost of the insulative tiers. In one embodiment, the seam top is elevationally-coincident with a top of the uppermost insulative tier. In one embodiment, the seam top is below the uppermost insulative tier. Any other attribute(s) or aspect(s) as shown and/or described herein with respect to other embodiments may be used. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Intervening material is laterally-between and longitudinally-along immediately-laterally-adjacent of the memory blocks. The intervening material comprises longitudinally-alternating first and second regions that individually have a vertically-elongated seam therein. The vertically-elongated seam in the first regions has a higher top than in the second regions. The seam tops in the second regions are elevationally-coincident with or below a bottom of an uppermost of the conductive tiers.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Intervening material is laterally-between and longitudinally-along immediately-laterally-adjacent of the memory blocks. The intervening material comprises a vertically-elongated seam therein that has a top that is elevationally-coincident with or below an uppermost of the insulative tiers.

In some embodiments, a method used in forming a memory array comprising strings of memory cells comprises forming a stack comprising vertically-alternating first tiers and second tiers. Horizontally-elongated trenches are formed into the stack to form laterally-spaced memory-block regions. Sacrificial material is formed in the trenches to completely fill the trenches. Vertical recesses are formed in the sacrificial material. The vertical recesses extend across the trenches laterally-between and longitudinally-spaced-along immediately-laterally-adjacent of the memory-block regions. The vertical recesses individually have a bottom that is below a top of an uppermost of the second tiers. Bridge material is formed in the vertical recesses to form bridges that extend across the trenches laterally-between and longitudinally-spaced-along the immediately-laterally-adjacent memory-block regions. The bridges individually have a bottom that is below the top of the uppermost second tier. The bridges individually have a planar top that is co-planar with the top of the uppermost second tier. The sacrificial material is replaced in the trenches with intervening material that is directly under and longitudinally-between the bridges.

In some embodiments, a method used in forming a memory array comprising strings of memory cells comprises forming a stack comprising vertically-alternating first tiers and second tiers. The first tiers comprise first sacrificial material. Horizontally-elongated trenches are formed into the stack to form laterally-spaced memory-block regions. Second sacrificial material is formed in the trenches to completely fill the trenches. Vertical recesses are formed in the second sacrificial material. The vertical recesses extend across the trenches laterally-between and longitudinally-spaced-along immediately-laterally-adjacent of the memory-block regions. The vertical recesses individually have a bottom that is below a top of an uppermost of the second tiers. Bridge material is formed in the vertical recesses to form bridges that extend across the trenches laterally-between and longitudinally-spaced-along the immediately-laterally-adjacent memory-block regions. The bridges individually have a bottom that is below the top of the uppermost second tier. The bridges individually have a planar top that is co-planar with the top of the uppermost second tier. The second sacrificial material is isotropically etched away selectively relative to the bridges and the second tiers. The first sacrificial material that is in the first tiers is isotropically etched away and replaced with conducting material of the individual conductive lines. Intervening material is formed in the trenches directly under and longitudinally-between the bridges between the immediately-laterally-adjacent memory-block regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array comprising strings of memory cells, comprising:
    laterally-spaced memory blocks individually comprising a vertical stack comprising alternating insulative tiers and conductive tiers, operative channel material strings of memory cells extending through the insulative tiers and the conductive tiers; and
    intervening material laterally-between and longitudinally-along immediately laterally-adjacent of the memory blocks, the intervening material comprising longitudinally-alternating first and second regions individually having a vertically-elongated seam therein, the vertically-elongated seam in the first regions having a higher top than in the second regions, seam tops in the second regions are elevationally-coincident with a bottom of the uppermost conductive tier.

2. The memory array of claim 1, wherein the seam tops in the second regions are in an uppermost half of the stack.

3. The memory array of claim 1 wherein the vertically-elongated seam is taller in the first regions than in the second regions.

4. The memory array of claim 1, wherein the vertically-elongated seam in the first and second regions comprise only one void space.

5. The memory array of claim 1 wherein the intervening material comprises a laterally-outermost insulative material and a laterally-inner material of different composition from that of the laterally-outermost insulative material, the vertically-elongated seam in the first and second regions being in the laterally inner material.

6. The memory array of claim 5 wherein the laterally-inner material is insulative.

7. The memory array of claim 1 wherein the intervening material is everywhere insulative between the immediately laterally-adjacent memory blocks.

8. A memory array comprising strings of memory cells, comprising:
    laterally-spaced memory blocks individually comprising a vertical stack comprising alternating insulative tiers and conductive tiers, operative channel material strings of memory cells extending through the insulative tiers and the conductive tiers; and
    intervening material laterally-between and longitudinally-along immediately laterally-adjacent of the memory blocks, the intervening material comprising a vertically-elongated seam therein, wherein a seam top of the vertically-elongated seam between insulating bridges is higher than a seam top of the vertically-elongated seam that is directly under an insulating bridge.

9. A memory array comprising strings of memory cells, comprising:
- laterally-spaced memory blocks individually comprising a vertical stack comprising alternating insulative tiers and conductive tiers, operative channel material strings of memory cells extending through the insulative tiers and the conductive tiers;
- intervening material laterally-between and longitudinally-along immediately laterally-adjacent of the memory blocks, the intervening material comprising a vertically-elongated seam therein that has a top that is elevationally coincident with or below an uppermost of the insulative tiers; and
- insulating bridges within the stack extending laterally between and longitudinally-spaced-along immediately-laterally-adjacent of the memory blocks, the insulating bridges being spaced above the seam top, the insulating bridges individually having a planar top that is co-planar with a planar top of the uppermost of the insulative tiers.

10. A memory array comprising strings of memory cells, comprising:
- laterally-spaced memory blocks individually comprising a vertical stack comprising alternating insulative tiers and conductive tiers, operative channel material strings of memory cells extending through the insulative tiers and the conductive tiers; and
- intervening material laterally-between and longitudinally-along immediately laterally-adjacent of the memory blocks, the intervening material comprising longitudinally-alternating first and second regions individually having a vertically-elongated seam therein, the vertically-elongated seam in the first regions having a higher top than in the second regions, seam tops in the second regions being below a bottom of an uppermost of the conductive tiers, wherein the seam tops in the second regions are in a lowest half of the stack.

11. A memory array comprising strings of memory cells, comprising:
- laterally-spaced memory blocks individually comprising a vertical stack comprising alternating insulative tiers and conductive tiers, operative channel material strings of memory cells extending through the insulative tiers and the conductive tiers; and
- intervening material laterally-between and longitudinally-along immediately laterally-adjacent of the memory blocks, the intervening material comprising longitudinally-alternating first and second regions individually having a vertically-elongated seam therein, the vertically-elongated seam in the first regions having a higher top than in the second regions, seam tops in the second regions being elevationally-coincident with or below a bottom of an uppermost of the conductive tiers, the vertically-elongated seam in the first and second regions comprises at least one void space, and the vertically-elongated seam in the first and second regions comprises multiple vertically spaced void spaces.

12. A memory array comprising strings of memory cells, comprising:
- laterally-spaced memory blocks individually comprising a vertical stack comprising alternating insulative tiers and conductive tiers, operative channel material strings of memory cells extending through the insulative tiers and the conductive tiers;
- intervening material laterally-between and longitudinally-along immediately laterally-adjacent of the memory blocks, the intervening material comprising longitudinally-alternating first and second regions individually having a vertically-elongated seam therein, the vertically-elongated seam in the first regions having a higher top than in the second regions, seam tops in the second regions being elevationally-coincident with a bottom of an uppermost of the conductive tiers; and
- insulating bridges within the stack extending laterally between and longitudinally-spaced-along immediately laterally-adjacent of the memory blocks, the insulating bridges being spaced above the seam tops in the second regions, the insulating bridges individually having a planar top that is co-planar with a planar top of an uppermost of the insulative tiers.

* * * * *